(12) United States Patent
Padmanabhan et al.

(10) Patent No.: US 12,490,451 B2
(45) Date of Patent: Dec. 2, 2025

(54) PROCESS OF FORMING AN ELECTRONIC DEVICE INCLUDING A COMPONENT STRUCTURE ADJACENT TO A TRENCH

(71) Applicant: SEMICONDUCTOR COMPONENTS INDUSTRIES, LLC, Phoenix, AZ (US)

(72) Inventors: Balaji Padmanabhan, Chandler, AZ (US); Zia Hossain, Tempe, AZ (US); Dean E. Probst, West Jordan, UT (US); Peter A. Burke, Portland, OR (US); Sauvik Chowdhury, San Jose, CA (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 946 days.

(21) Appl. No.: 17/653,226

(22) Filed: Mar. 2, 2022

(65) Prior Publication Data
US 2023/0282732 A1 Sep. 7, 2023

(51) Int. Cl.
*H10D 30/01* (2025.01)
*H10D 64/00* (2025.01)
*H10D 64/01* (2025.01)

(52) U.S. Cl.
CPC ......... *H10D 30/0297* (2025.01); *H10D 64/01* (2025.01); *H10D 64/117* (2025.01)

(58) Field of Classification Search
CPC .. H10D 30/0297; H10D 64/01; H10D 64/117; H10D 8/605; H10D 30/635; H10D 30/668; H10D 12/481; H10D 84/141; H10D 8/051; H10D 30/025; H10D 64/256; H10D 62/85; H10D 62/127; H10D 84/146; H10D 62/106
See application file for complete search history.

(56) References Cited

U.S. PATENT DOCUMENTS

| 9,679,890 | B2 | 6/2017 | Sakar et al. |
| 10,658,351 | B2 | 5/2020 | Padmanabhan et al. |
| 11,158,734 | B2 | 10/2021 | Ogura et al. |
| 2006/0049454 | A1 | 3/2006 | Thapar |

(Continued)

OTHER PUBLICATIONS

PCT/US2022/079639 International Search Report and Written Opinion; pp. 1 to 17; Mar. 1, 2023 (corresponds to U.S. Appl. No. 17/653,226).

(Continued)

*Primary Examiner* — Khaja Ahmad
*Assistant Examiner* — Khatib A Rahman
(74) *Attorney, Agent, or Firm* — Abel Schillinger, LLP

(57) ABSTRACT

A process of forming an electronic device can form an accumulation channel or an integrated diode by selective doping parts of a workpiece. In an embodiment, a doped region can be formed by implanting a sidewall of a body region. In another embodiment, a doped region can correspond to a remaining portion of a semiconductor layer after forming another doped region by implanting into a contact opening. The accumulation channel or the integrated diode can lower the barrier for a body diode turn-on. Reduced stored charge and $Q_{RR}$ may be achieved, leading to lower switching losses.

20 Claims, 13 Drawing Sheets

(56) References Cited

U.S. PATENT DOCUMENTS

| | | |
|---|---|---|
| 2006/0267088 A1* | 11/2006 | Sharp .................. H10D 30/0295 |
| | | 257/E21.345 |
| 2006/0273386 A1 | 12/2006 | Yilmaz et al. |
| 2007/0082441 A1 | 4/2007 | Kraft et al. |
| 2009/0283823 A1 | 11/2009 | Izumi |
| 2010/0193835 A1* | 8/2010 | Hshieh .................. H10D 12/481 |
| | | 257/E21.385 |
| 2011/0073938 A1* | 3/2011 | Takahashi ............ H10D 30/665 |
| | | 438/270 |
| 2012/0187498 A1 | 7/2012 | Qu et al. |
| 2014/0054691 A1 | 2/2014 | Yilmaz et al. |
| 2014/0110723 A1 | 4/2014 | Ikegami et al. |
| 2016/0035844 A1 | 2/2016 | Uchimura et al. |
| 2016/0099351 A1 | 4/2016 | Hebert et al. |
| 2017/0047431 A1* | 2/2017 | Bobde .................. H10D 64/256 |
| 2018/0102435 A1 | 4/2018 | Hebert et al. |
| 2019/0341308 A1* | 11/2019 | Urakami ........... H01L 21/02104 |

OTHER PUBLICATIONS

Uchida et al.; "Novel SiC Power MOSFET with Integrated Unipolar Internal Inverse MOS-Channel Diode"; IEDM; IEEE; pp. IEDM11-IEDM602 to IEDM11-IEDM605 (2011).

Singh et al.; "Development of High-Current 4H—SiC Accufet"; IEEE Trans. On Electron Devices; vol. 50, No. 2; IEEE: pp. 471-478 (2003).

Baliga et al.; "The Accumulation-Mode Field-Effect Transistor: A New Ultralow On-Resistance MOSFET"; IEEE Electron Device Letters; vol. 13, No. 8, IEEE; pp. 427-429 (1992).

Doolittle, Alan; "Ion Implantation"; ECE 6450, Chapter 5, Lecture 5; Georgia Inst. of Tech.; pp. 1-3, printed from Internet on Jan. 1, 2021.

\* cited by examiner

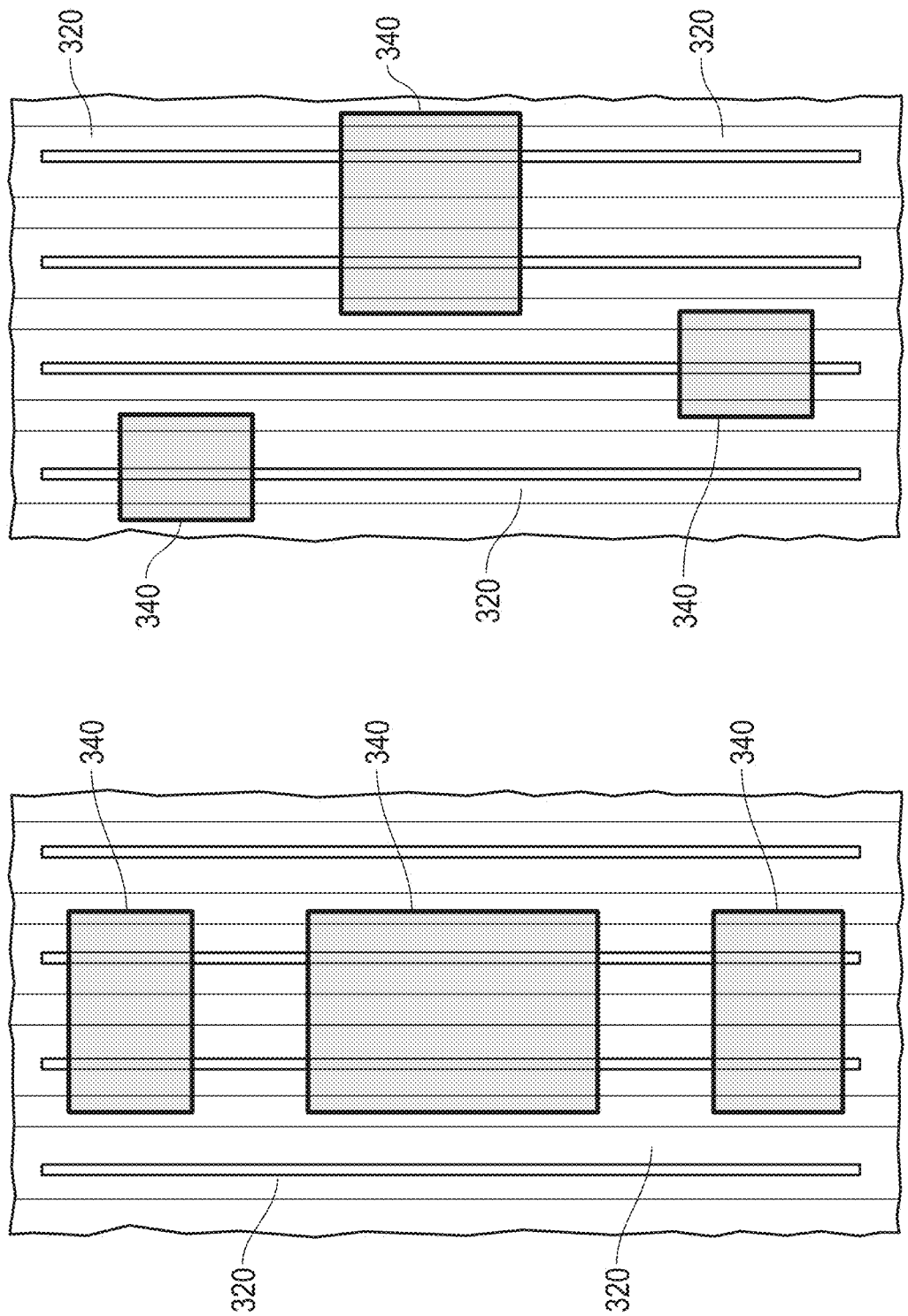

US 12,490,451 B2

PROCESS OF FORMING AN ELECTRONIC DEVICE INCLUDING A COMPONENT STRUCTURE ADJACENT TO A TRENCH

FIELD OF THE DISCLOSURE

The present disclosure relates to electronic devices and processes of forming the same, and more particularly to, electronic devices including component structures adjacent to trenches and processes of forming the same.

RELATED ART

A power transistor can be an insulated gate field-effect transistor and include a body diode. The body diode conducts current in a direction that is reverse to the current flow when the transistor is in an on-state. Conduction of the body diode causes injection and storage of minority carriers that must be removed before the transistor can be switched to an off-state. The stored charge, which corresponds to the reverse recovery charge ($Q_{RR}$), leads to switching losses. Reducing $Q_{RR}$ is beneficial to increasing efficiency; however, other transistor parameters need to remain within acceptable limits.

BRIEF DESCRIPTION OF THE DRAWINGS

Embodiments are illustrated by way of example and are not limited in the accompanying figures.

FIG. 10 includes an illustration of a top view of the electronic device including a transistor portion and component portions in accordance with still another embodiment.

FIG. 11 includes an illustration of a top view of the electronic device including a transistor portion and component portions in accordance with a further embodiment.

Figure 1:
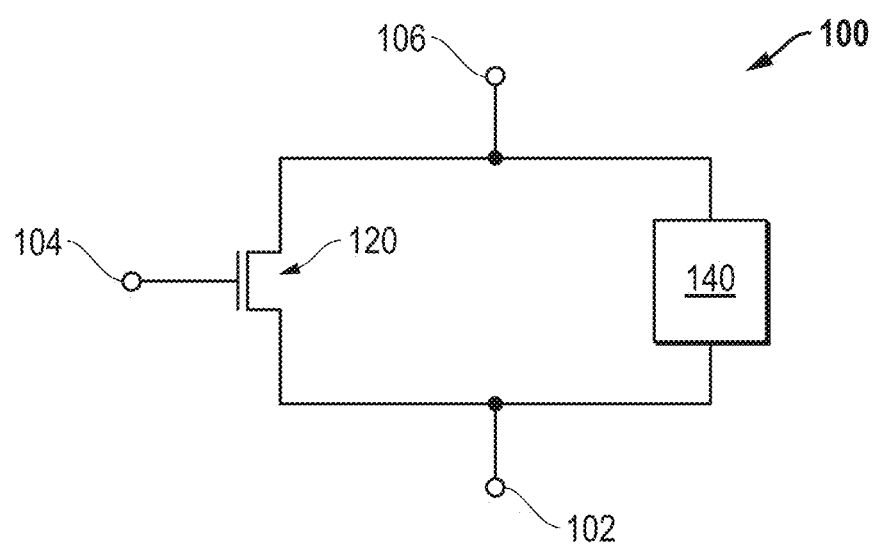
FIG. 1 includes a schematic drawing of a circuit that includes a transistor and a component.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

The term "electrically coupled" is intended to mean a connection, linking, or association of two or more electronic components, circuits, systems, or any combination of: (1) at least one electronic component, (2) at least one circuit, or (3) at least one system in such a way that a signal (e.g., current, voltage, or optical signal) may be partially or completely transferred from one to another. A subset of "electrically coupled" can include an electrical connection between two electronic components. In a circuit diagram, a node corresponds to an electrical connection between the electronic components. Thus, an electrical connection is a specific type of electrical coupling; however, not all electrical couplings are electrical connections. Other types of electrical coupling include capacitive coupling, resistive coupling, and inductive coupling.

Unless explicitly stated to the contrary, the terms "horizontal," "lateral," and their variants are in a direction along or parallel to a primary surface of a substrate or semiconductor layer or region, and the terms "vertical" and its variants are in a direction perpendicular to a primary surface of a substrate or a semiconductor layer or region. For example, two features may be laterally offset and may or may not lie at different elevations. Thus, a lateral offset may be seen with a top view of plan view of an electronic device.

With respect dimensions, length is measured in a direction along or parallel to a direction corresponding to a principal current flow through a component, region, or layer, and width is measured in a direction perpendicular to length.

The terms "normal operation" and "normal operating state" refer to conditions under which an electronic component or device is designed to operate. The conditions may be obtained from a data sheet or other information regarding voltages, currents, capacitance, resistance, or other electrical conditions. Thus, normal operation does not include operating an electrical component or device well beyond its design limits.

The term "power transistor" is intended to mean a transistor that has a product of a drain-to-source voltage ($V_{DS}$)

when the transistor is in an off-state times drain current ($I_D$) when the transistor is in an on-state is at least 11 W. For example, a transistor may have $V_{DS}$ of 40 V when in the off-state and have $I_D$ of 12 A when in the on-state. Such a transistor is a power transistor because the product of 40 V×12 A is 480 W.

Group numbers correspond to columns within the Periodic Table of Elements based on the IUPAC Periodic Table of Elements, version dated Dec. 1, 2018.

The terms "on," "overlying," and "over" may be used to indicate that two or more elements are in direct physical contact with each other. However, "over" may also mean that two or more elements are not in direct contact with each other. For example, "over" may mean that one element is above another element, but the elements do not contact each other and may have another element or elements in between the two elements.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about," "approximately," or "substantially" is intended to mean that a value of a parameter is close to a stated value or position. However, minor differences may prevent the values or positions from being exactly as stated. Thus, differences of up to ten percent (10%) (and up to twenty percent (20%) for semiconductor doping concentrations) for the value are reasonable differences from the ideal goal of exactly as described.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

A process of forming an electronic device can form an accumulation channel or an integrated diode by selective doping parts of a workpiece. In an embodiment, a doped region can be formed by implanting a sidewall of a body region. In another embodiment, a doped region can correspond to a remaining portion of a semiconductor layer after forming another doped region by implanting into a contact or other similar opening. The accumulation channel or the integrated diode can lower the barrier for a body diode turn-on. Reduced stored charge and $Q_{RR}$ may be achieved, leading to lower switching losses.

FIG. 1 includes a schematic diagram of circuit 100 that includes a power transistor 120 and a component 140. The component 140 helps to dissipate $Q_{RR}$ associated with the power transistor 120. A source terminal 106 is electrically coupled to a source of the power transistor 120 and a terminal of the component 140, and a drain terminal 102 is electrically coupled to a drain of the power transistor 120 and another terminal of the component 140. A control terminal 104 is electrically coupled to a gate of the power transistor 120. One or more other electrical connections may be made to the component 140 but are not illustrated in FIG. 1.

The power transistor 120 can be an insulated-gate field-effect transistor (IGFET). The power transistor 120 can include one or more transistor structures. In an embodiment, the power transistor 120 includes tens, hundreds, or over a thousand transistor structures, where drain regions of the transistor structures are electrically connected to one another, source regions of the transistor structures are electrically connected to one another, and gate electrodes of the transistor structures are electrically connected to one another. The component 140 can be implemented using a variety of different circuit components. More details on some options for the component 140 are described in more detail below. Such options are meant to illustrate and not to limit possible designs for the component 140.

In an embodiment, the component 140 can be in the form of an accumulation-channel field-effect transistor (ACCUFET). The ACCUFET can have some properties that are substantially similar and other properties that are significantly different as compared to the power transistor 120. For example, the power transistor 120 and ACCUFET can have approximately the same threshold voltage, and the power transistor 120 may have a slightly steeper subthreshold slope as compared to the ACCUFET. The ACCUFET allows $Q_{RR}$ associated with the electronic device to be dissipated substantially more quickly than if the component 140 was not present in the circuit 100. The value of the resistance associated with the accumulation channel of the ACCUFET can be determined by performing a simulation that provides a leakage current that is acceptable (not too high) for a particular application.

Figure 2:
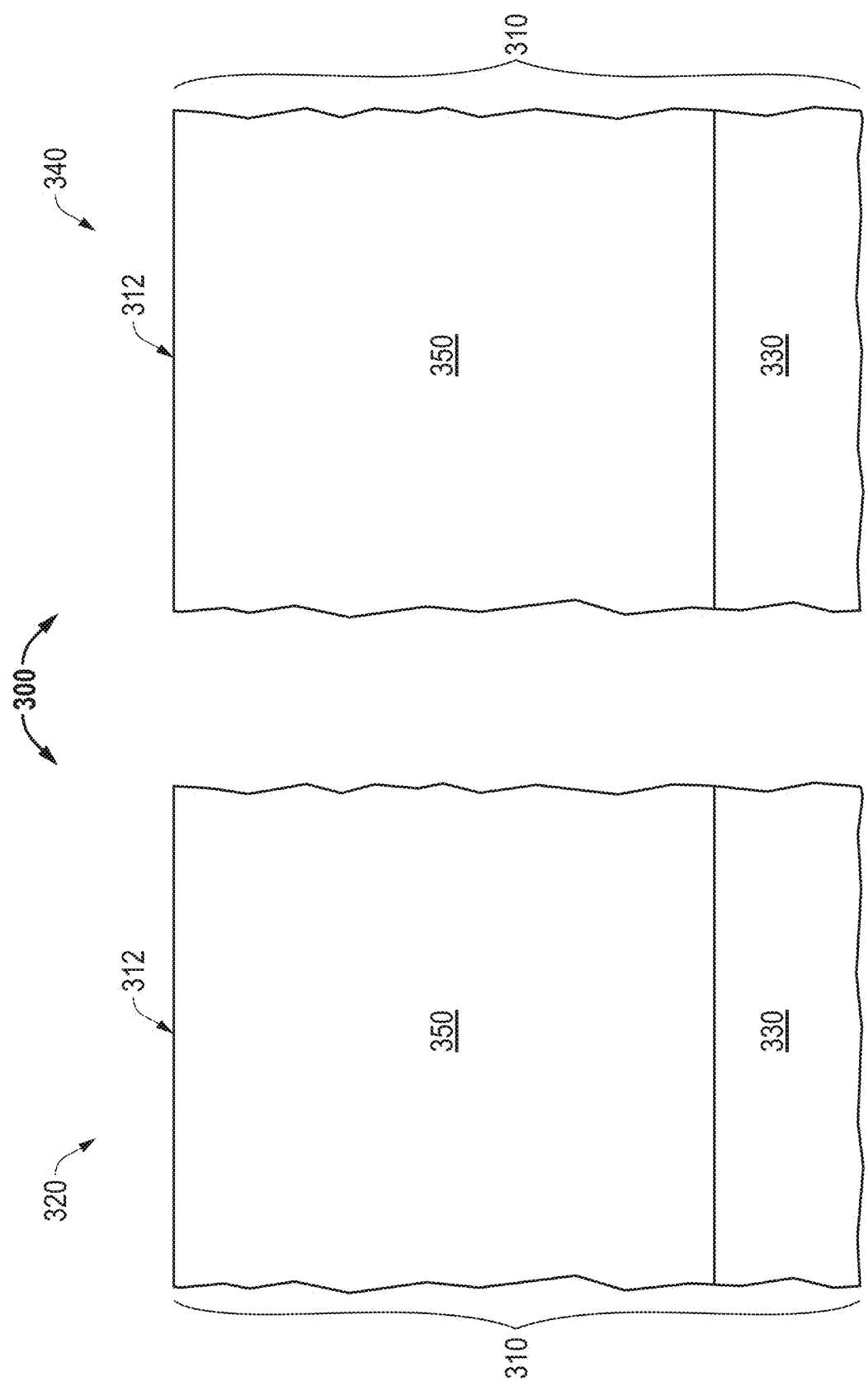
FIG. 2 includes an illustration of cross-sectional views of portion of a workpiece that includes a substrate.

FIG. 2 includes an illustration of cross-sectional views of a power transistor portion 320 and a component portion 340 of a workpiece 300. The power transistor portion 320 corresponds to the power transistor 120, and the component portion 340 corresponds to the component 140. The workpiece 300 includes a substrate 310 having a primary surface 312. The substrate 310 includes a base region 330 and a semiconductor layer 350. The base region 330 may be in the form of a semiconductor wafer. In an embodiment, the base region 330 can include one or more Group 14 elements, such as Si or SiC, and be a heavily doped with an n-type or a p-type dopant. For the purposes of this specification, heavily doped is intended to mean an average or a peak dopant concentration of at least $1 \times 10^{19}$ atoms/cm$^3$.

The semiconductor layer 350 can be epitaxially grown from the base region 330. The semiconductor layer 350 can have a dopant with the same conductivity type as the base region 330. In an embodiment, the semiconductor layer 350 can have an average dopant concentration in a range from $1 \times 10^{15}$ atoms/cm$^3$ to $9 \times 10^{17}$ atoms/cm$^3$. For the purposes of this specification, the semiconductor layer 350 is a type of doped region. The thickness of the semiconductor layer 350 can depend on the voltage rating of the power transistor 120

(voltage difference between the drain and source of the power transistor 120 when in the off-state) and the average dopant concentration (or dopant concentration profile) of the semiconductor layer 350. In an embodiment, the thickness of the semiconductor layer 350 can be in a range from 2 microns to 9 microns. In another embodiment, other dopant concentrations and thicknesses for the semiconductor layer 350 can be used without deviating from the concepts described herein. The semiconductor layer 350 may or may not have a higher dopant concentration adjacent to the base region 330.

In another embodiment, the semiconductor layer 350 may be replaced by a plurality of semiconductor layers that are epitaxially grown. In a particular embodiment, a relatively thinner semiconductor lower layer and a relatively thicker upper semiconductor layer may be used. The relatively thinner semiconductor layer may help to control the electrical field near the base region 330. As initially formed, the relatively thinner lower semiconductor layer may have an average dopant concentration that is between the dopant concentration of the base region 330 and an average dopant concentration of the relatively thicker semiconductor layer. In another particular embodiment, a relatively thinner semiconductor layer can be used near the primary surface 312. In this embodiment, as initially formed, the relatively thinner semiconductor layer may be undoped or have an average dopant concentration that is significantly lower than an average dopant concentration of a subsequently-formed body region. In a further particular embodiment, a lower semiconductor layer, a middle semiconductor layer, and an upper semiconductor layer can be used. The middle semiconductor layer can be thicker than each of the lower semiconductor layer. The upper semiconductor layer and have an average dopant concentration corresponding to a desired on-state resistance ($R_{DSON}$) for the power transistor 120. The lower semiconductor layer may be used to control the electrical field near the base region 330 as previously described, and the upper semiconductor layer may be used to allow better control over the average dopant concentration of a subsequently-formed body region. After reading this specification, skilled artisans will be able to determine the number and dopant concentrations of semiconductor layers formed over the base region 330.

Figure 3:
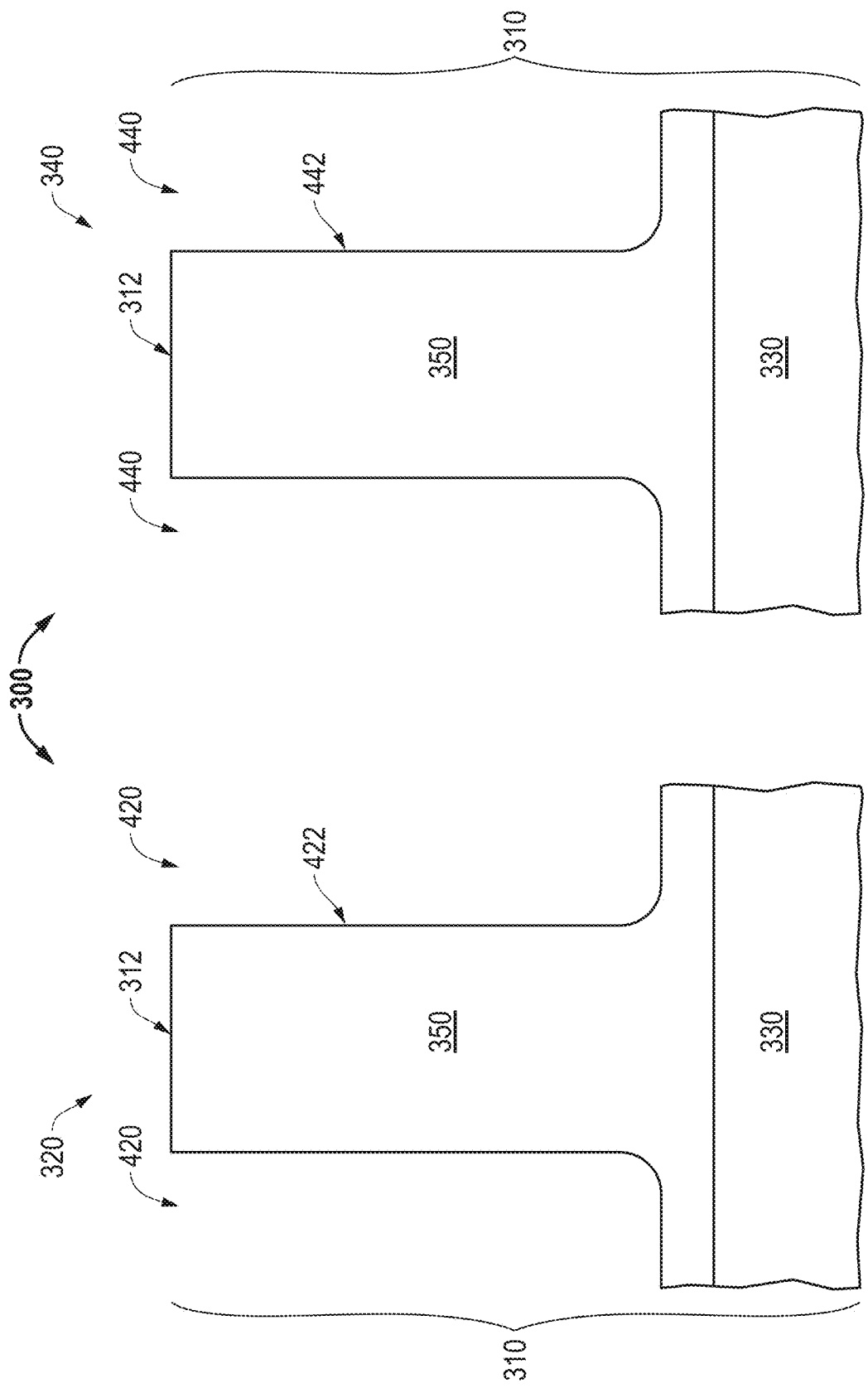
FIG. 3 includes an illustration of a cross-sectional view of the workpiece of FIG. 2 after patterning the substrate to define trenches.

Referring to FIG. 3, portions of the substrate 310 are removed to define trenches 420 within the power transistor portion 320 and trenches 440 within the component portion 340. A semiconductor pillar 422 is immediately adjacent to the trenches 420, and a semiconductor pillar 442 is immediately adjacent to the trenches 440. One or more other trenches and semiconductor pillar are formed but are not illustrated in FIG. 3. Within the power transistor portion 320, the other trenches and semiconductor pillars are substantially identical to the trenches 420 and the semiconductor pillar 422, and within the component portion 340, one or more other trenches and semiconductor pillars, if present, are substantially identical to the trenches 440 and the semiconductor pillar 442.

At least one electrode will be subsequently formed within each of the trenches 420 and 440. The widths of the trenches 420 and 440, as measured at the top of the trenches 420 and 440, should allow for the subsequently formation of an insulating layer and electrode(s); however, as the width increases, the effective channel width of the power transistor 120 may decrease. In an embodiment, the widths of the trenches can be in a range from 0.3 micron to 8.0 microns, 0.6 micron to 6.0 microns, or 0.9 micron to 4.0 microns.

The trenches 420 and 440 extend into and at least partly through the semiconductor layer 350. In an embodiment, the trenches 420 and 440 do not extend to and are spaced apart from the base region 330 by at least a portion of the of the semiconductor layer 350. As measured from the primary surface 312, in an embodiment, the trenches 420 and 440 extend to a depth of at most 9 microns, at most 7 microns, or at most 5 microns. In the same or a different embodiment, the trenches 420 and 440 extend to a depth of at least 0.7 micron. The depths of the trenches 420 and 440 may depend on the voltage rating of the device, and thus, the depths of the trenches 420 and 440 may be outside the values previously described.

Figure 4:
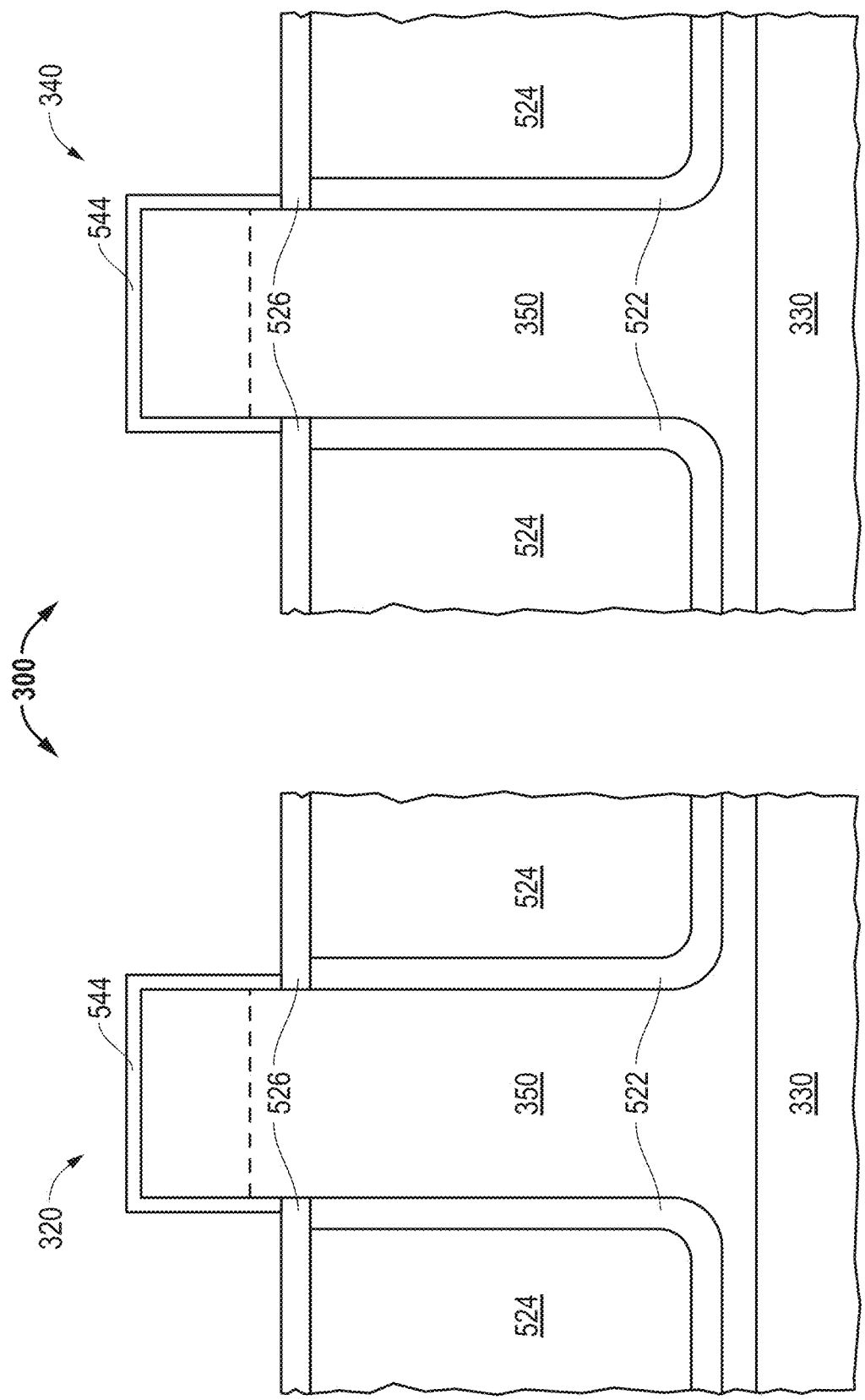
FIG. 4 includes an illustration of a cross-sectional view of the workpiece of FIG. 3 after forming an insulating layer along sidewalls and bottoms of the trenches, shield electrodes, an insulating layer over the shield electrodes, and a gate dielectric layer.

FIG. 4 includes an illustration of a cross-sectional view of the workpiece 300 after forming an insulating layer 522, shield electrodes 524, an insulating layer 526, and a gate dielectric layer 544. The insulating layer 522 is formed along exposed portions of the semiconductor layer 350. The insulating layer 522 partly fills, but does not completely fill, the trenches 420 and 440. The insulating layer 522 can include an oxide, a nitride, an oxynitride, or any combination thereof. In an embodiment, the insulating layer 522 can include a single insulating film, and in another embodiment, the insulating layer 522 can include a plurality of insulating films. The insulating layer 522 has a thickness in a range from approximately 70 nm to approximately 1000 nm. The insulating layer 522 can be grown, deposited, or a combination of grown and deposited.

A conductive layer is formed over the insulating layer 522 and within the trenches 420 and 440. The conductive layer substantially fills remaining portions of the trenches 420 and 440. The conductive layer can include a metal-containing or semiconductor-containing material. In an embodiment, the conductive layer can include a heavily doped semiconductor material, such as amorphous silicon or polysilicon. In another embodiment, the conductive layer includes a plurality of films, such as an adhesion film, a barrier film, and a conductive fill material. In a particular embodiment, the adhesion film can include a refractory metal, such as titanium, tantalum, or the like; the barrier film can include a refractory metal nitride, such as titanium nitride, tantalum nitride, or the like, a refractory silicide, such as tungsten silicide, titanium silicide, or the like, or a refractory metal-semiconductor-nitride, such as TaSiN; and the conductive fill material can include tungsten. In a more particular embodiment, the conductive layer can include Ti/TiN/W. The selection of the number of films and composition(s) of those film(s) depend on electrical performance, the temperature of a subsequent heat cycle, another criterion, or any combination thereof. Refractory metals and refractory metal-containing compounds can withstand high temperatures (e.g., melting points of such materials can be at least 1400° C.), may be conformally deposited, and have a lower bulk resistivity than heavily doped n-type silicon. After reading this specification, skilled artisans will be able to determine the composition of the conductive layer to meet their needs or desires for a particular application.

A portion of the conductive layer that overlies the insulating layer 522 outside of the trenches 420 and 440 is removed. The removal can be performed using a chemical-mechanical polishing or blanket etching technique. The insulating layer 522 may be used as a polish-stop or etch-stop layer.

The exposed portions of the conductive structures are recessed to form the shield electrodes 524 within the trenches 420 and 440. The removal may be performed using a wet or dry etching technique. The highest elevations of the shield electrodes 524 lie below the lowest elevations of subsequently-formed body regions. Although not yet formed, the dashes lines in FIG. 4 are used as points of reference to illustrate the depth of the body regions in the finished device The highest elevations of the shield electrodes 524 can be in a range from approximately 0.4 micron to 3.0 microns below the primary surface 312.

A portion of the insulating layer 522 that overlies the primary surface 312 and within the trenches 420 and 440 at elevations above the shield electrodes is removed. The insulating layer 526 is formed along exposed portions of the workpiece 300. The insulating layer 526 partly fills, but does not completely fill, the trenches 420 and 440. The insulating layer 526 can include an oxide, a nitride, an oxynitride, or any combination thereof. In an embodiment, the insulating layer 526 can include a single insulating film, and in another embodiment, the insulating layer 526 can include a plurality of insulating films. The insulating layer 526 has a thickness in a range from approximately 70 nm to approximately 500 nm. The insulating layer 526 can be grown or deposited.

In an embodiment, subsequently-formed gate electrodes will be formed over the insulating layer 526. The top surface of the insulating layer 526 within the trenches 420 and 440 lies at elevations that are below the lowest elevations of their corresponding subsequently-formed body regions. Thus, the amount of recess of the conductive structures in forming the shield electrodes 524 and the thickness of the insulating lays 526 are selected to achieve needed or desired locations for the bottom surfaces of the subsequently-formed gate electrodes.

Figure 5:
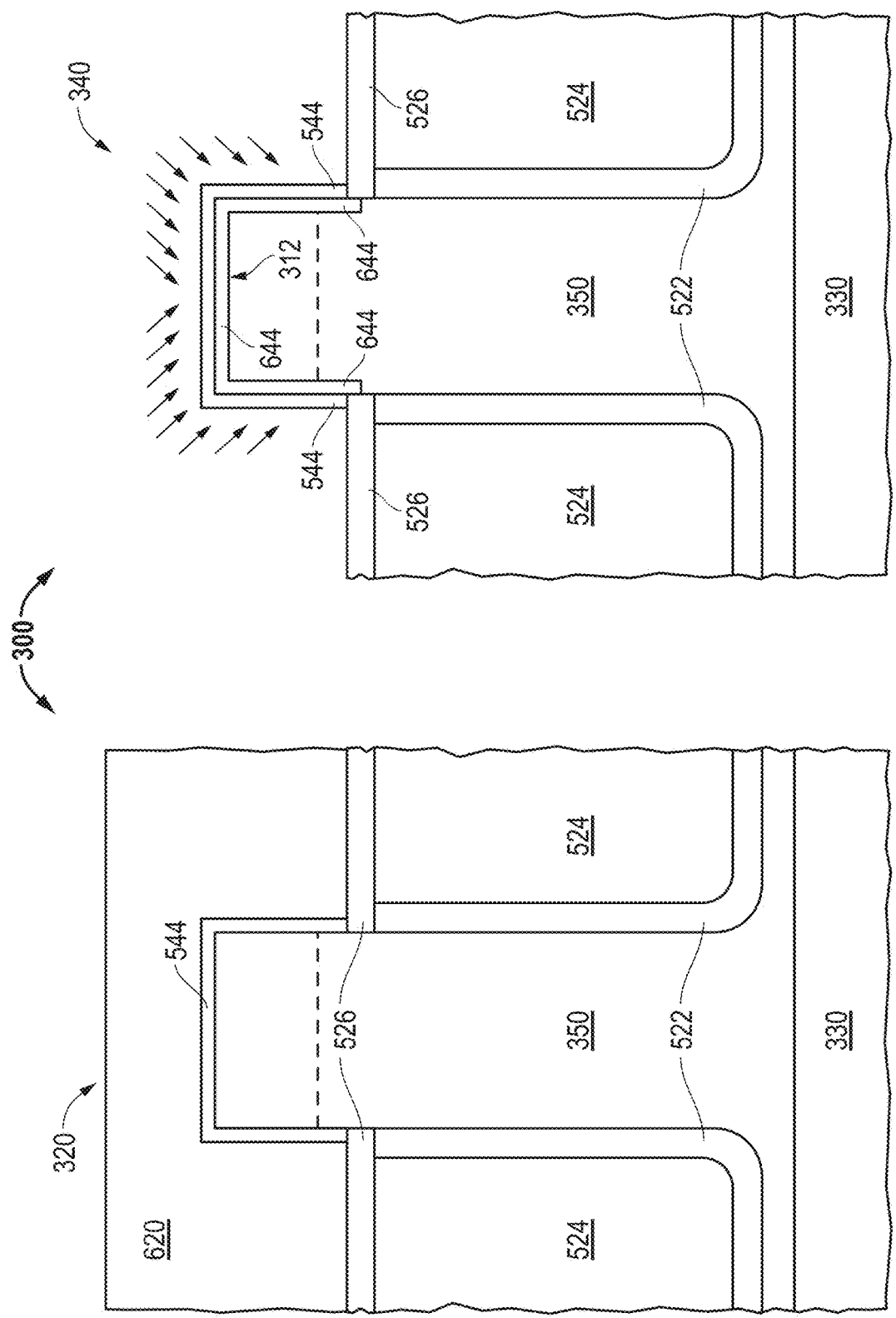
FIG. 5 includes an illustration of a cross-sectional view of the workpiece of FIG. 4 during formation of doped regions within component portions.

A portion of the insulating layer 526 that overlies the primary surface 312 and within the trenches 420 and 440 at elevations above an upper surface of the insulating layer within the centers of the trenches 420 and 440 is removed. The gate dielectric layer 544 is formed along surfaces of the workpiece 300 that are not covered by the insulating layers 522 and 526. The gate dielectric layer 544 can include an oxide, a nitride, an oxynitride, or any combination thereof. The gate dielectric layer 544 is significantly thinner than each of the insulating layers 522 and 526. The gate dielectric layer 544 has a thickness in a range from 2 nm to 150 nm. The gate dielectric layer 544 can be grown, deposited, or a combination of grown and deposited. FIG. 5 illustrates the workpiece during a doping step to form doped regions 644 within the component portion 340. The doped regions 644 can be accumulation channels for the component structure illustrated. The doped regions 644 have the same conductivity type as the semiconductor layer 350. The doped regions 644 can lie along a conduction path between the semiconductor layer 350 and a subsequently-formed contact, such that current can flow through the doped regions 644 when the ACCUFET is operating in the third quadrant of the $I_D$-$V_{DS}$ curve.

The doped regions 644 within the ACCUFET cause the component 140 to have a higher leakage current when the ACCUFET is in an off-state as compared to the power transistor 120 when in the off-state. Lower $Q_{RR}$ is desired, and a lower resistance helps to reduce the $Q_{RR}$; however, leakage current for the component 140 may become too high if, when the ACCUFET is in the off-state, the resistance of the ACCUFET is too low. Simulations can be performed to determine a resistance or range of resistances that can be used for the ACCUFET.

After the resistance is determined, the properties of the doped regions 644 to achieve the resistance can be determined. In an embodiment, the doped regions 644 can have an average dopant concentration in a range from $1 \times 10^{15}$ atoms/cm$^3$ to $1 \times 10^{19}$ atoms/cm$^3$, and in a more particular embodiment, in a range from $1 \times 10^{16}$ atoms/cm$^3$ to $9 \times 10^{17}$. The doped regions 644 may have a higher average dopant concentration as compared to the semiconductor layer 350 near the tops of the semiconductor pillars.

Each thickness of the doped regions 644 is measured as a distance from the sidewall of the corresponding trench 440 to a pn junction with its corresponding subsequently-formed body region. The thickness can be in a range from 5 nm to 200 nm, and in embodiment can be in a range from 11 nm to 95 nm.

The lengths of the doped regions 644 are measured in a direction of current flow through the doped regions 644, which is substantially perpendicular to the primary surface 312. As formed, each length of the doped regions 644 can extend from the primary surface 312 to elevations below a lowermost elevation of subsequently-formed body regions of the ACCUFET (corresponding to the dashed line) and into the semiconductor layer 350. The lengths of the doped regions 644 can be in a range from 0.2 micron to 1.5 microns, and in an embodiment, can be in a range from 0.3 micron to 0.9 micron.

Attention is now directed to the process used to form the doped regions 644. A resist member 620 covers the power transistor portion 320, so that the semiconductor layer 350 within the power transistor portion 320 is not doped when forming the doped regions 644 within the component portion 340. The doping to form the doped regions 644 can be formed using a tilt angle implant, as illustrated by the arrows in FIG. 5. The angle for a tilt angle is specified as an angle from vertical, perpendicular to the primary surface 312. Thus, there is no tilt angle (0°) when ions are directed to the workpiece in a direction perpendicular to the primary surface 312. In an embodiment, the tilt angle can be in a range from 7.5° to 45°. The workpiece 300 can be rotated during the implant to ensure all surfaces not covered by the resist member 620 are implanted.

The energy for the implant can be selected such that, when considering the tilt angle and the thickness of the gate dielectric layer 544, a desired thickness of the doped regions 644 (distance from the sidewall of the corresponding trench 440) can be achieved. Data tables for projected range ($R_P$) and straggle ($\Delta R_P$) may be consulted, or alternatively, simulations or empirical data can be collected to determine a needed or desired combination of tilt angle and energy for the implant. In an embodiment, the energy can be in a range from 5 keV to 200 keV, and in an embodiment can be in a range from 11 keV to 95 keV. A dose is selected to achieve a desired dopant concentration for the doped regions 644. After formation, the doped regions 644 are formed, the resist member 620 over the power transistor portion 320 is removed.

In another embodiment, an implant screen layer (not illustrated) may be used, so that the implant is performed through the implant screen layer and not through the gate dielectric layer 544. The implant screen layer can include an oxide, a nitride, or an oxynitride. The implant screen layer can have a thickness in a range from 2 nm to 50 nm. The implant screen layer can be grown or deposited. The doping to form the doped regions 644 can then be performed. Similar to the gate dielectric layer 544 as previously described, the thickness of the implant screen layer can be taken into account when determining an energy for an implant used to form the doped regions 644. After the implant, the implant screen layer is removed, and the gate dielectric layer 544 as previously described is formed. In this embodiment, the implant screen layer, rather than the gate dielectric layer 544, receives any implant damage that may occur during doping, and the implant screen layer is removed before forming the gate dielectric layer 544.

Figure 6:
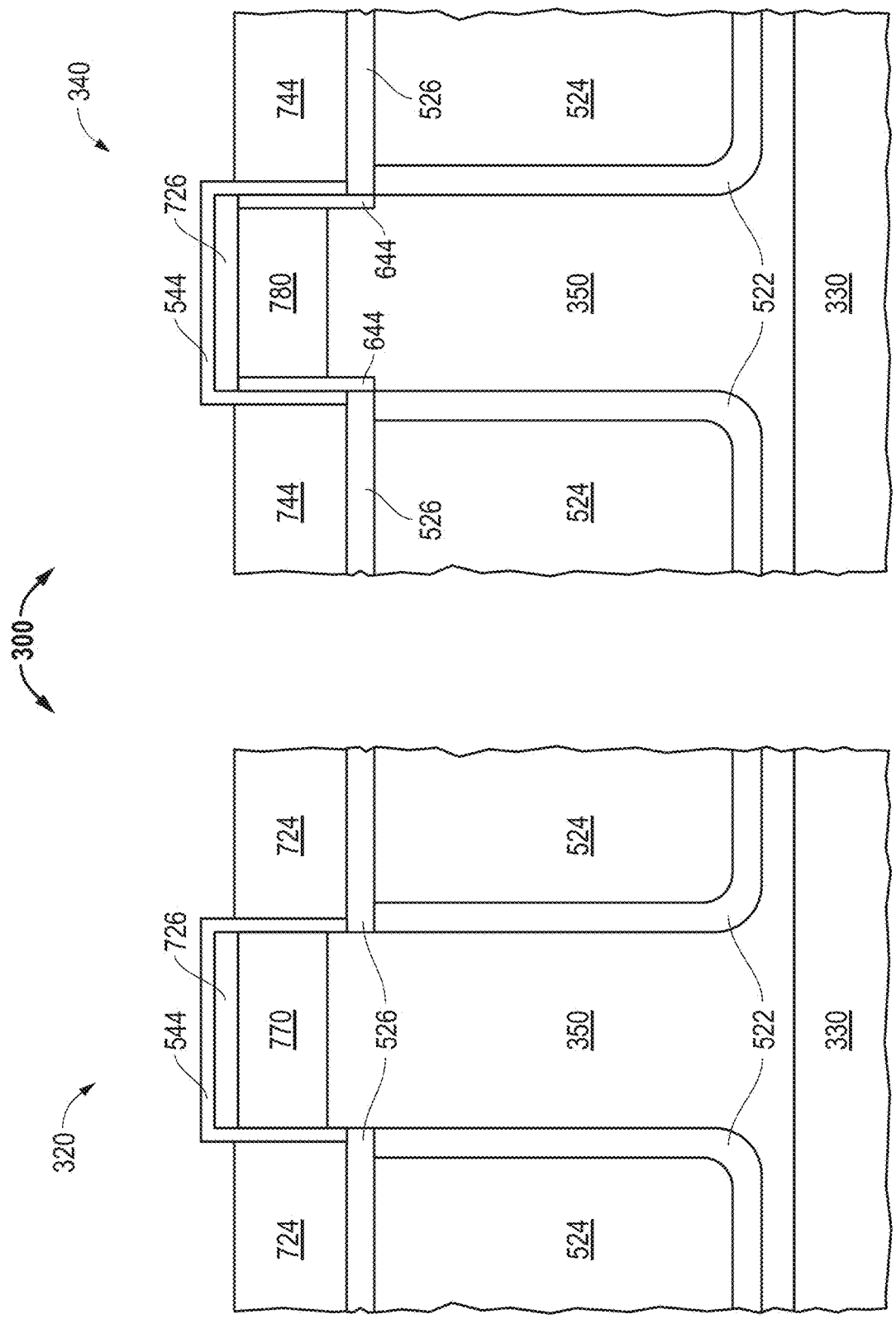
FIG. 6 includes an illustration of a cross-sectional view of the workpiece of FIG. 5 after forming electrodes within the trenches and source regions.

FIG. 6 includes an illustration of the workpiece 300 after forming gate electrodes 724, electrodes 744, and source regions 726. A conductive layer is formed over the workpiece 300 and within the trenches 420 and 440. The conductive layer substantially fills remaining portions of the trenches 420 and 440. Because the conductive layer will form gate electrodes, a material in contact with the gate dielectric layer 544 may be selected for a particular work function to help achieve a desired threshold voltage for the power transistor 120. The conductive layer for the gate electrodes 724 and the electrodes 744 can include any of the materials and number of films as previously described with respect to the shield electrodes 524. The gate electrodes 724 and the electrodes 744 can have the same composition (material and number of films) or a different composition as compared to the shield electrodes 724.

A portion of the conductive layer that lies outside of the trenches 420 and 440 is removed. The removal can be performed using a chemical-mechanical polishing or blanket etching technique. The portions of the conductive layer within the trenches can be recessed to reduce source-to-gate capacitance. The uppermost portions of the gate electrodes 724 and electrodes 744 can be at elevations higher than lowermost portions of their corresponding, adjacent source regions 726.

Body regions 770 and 780 for the power transistor 120 and the ACCUFET, respectively, are formed. In this embodiment, the body regions 770 and 780 are formed after forming the gate electrodes 724 and 744. In another embodiment, the body regions 770 and 780 can be formed before forming the gate electrodes 724 and 744. In a further embodiment, the body regions 770 and 780 may be formed before forming the doped regions 644 that correspond to the accumulation channel of the ACCUFET. After reading this specification, skilled artisans will be able to determine when the body regions 770 and 780 are formed relative to other features of the electronic device to meet the needs or desires for a particular application.

The body region 770 has an opposite conductivity type as compared to the base region 330 and the semiconductor layer 350. For example, when the base region 330 and the semiconductor layer 350 are n-type doped, the body region 770 can be p-type doped. At least a portion of the body region 770 will include the channel region for the transistor structure illustrated. The average dopant concentration for the body region 770 can affect the threshold voltage of the power transistor 120. Thus, the selection of a particular average dopant concentration can be determined based on a desired threshold voltage and potentially other transistor properties. In an embodiment, the average dopant concentration of the body region 770 can be in a range from $1 \times 10^{15}$ atoms/cm$^3$ to $5 \times 10^{17}$ atoms/cm$^3$. The average dopant concentration for the body region 770 may be higher, lower, or the same as the average dopant concentration for the semiconductor layer 350. The thickness of the body region 770 is selected to achieve a desired channel length for the power transistor 120. A portion of the body region 770 is counter-doped for a subsequently-formed current-carrying region, such as a source region. Thus, as originally formed, the body region 770 can have a thickness that is typically at most 0.99 micron, at most 0.90 micron, or at most 0.8 microns. In the same or different embodiment, the thickness may be at least 0.11 micron. Other dopant concentrations and thicknesses of the body region 770 can be used to achieve needed or desired properties for the power transistor 120.

Referring to the component portion 340, the body region 780 has an opposite conductivity type as compared to the base region 330 and the semiconductor layer 350. For example, when the base region 330 and the semiconductor layer 350 are n-type doped, the body region 780 can be p-type doped. The body region 780 can be formed during the same process operation when forming the body region 770. Thus, the body region 780 can have the same conductivity type and substantially the same average dopant concentration and thickness as the body region 770. In another embodiment, the process of forming the body region 780 can have at least some difference than the process of forming the body region 770. Thus, the average dopant concentration of the body region 780 may be higher or lower as compared to the body region 770, and the thickness of the body region 780 may be thicker or thinner as compared to the body region 770.

As compared to the body region 770, the body region 780 may have a wider range of average dopant concentrations, thicknesses, or both concentrations and thicknesses. For example, the average dopant concentration for the body region 780 can be in a range from $1 \times 10^{11}$ atoms/cm$^3$ to $1 \times 10^{19}$ atoms/cm$^3$. In the same or different embodiment, the thickness for the body region 780 can be at most 2.0 micron, at most 1.2 micron, or at most 0.8 micron. In the same or different embodiment, the thickness may be at least 0.11 micron.

Although not illustrated, part of the body region 780 can extend to a sidewall of one of the trenches 440. Thus, the doped region 644 may be discontinuous along such sidewall.

The source regions 726 can have the same conductivity type as the doped regions 644 and semiconductor layer 350. The source regions 726 can have a peak dopant concentration sufficient to allow ohmic contacts to be made to subsequently formed contacts. In an embodiment, the peak dopant concentration of the source regions 726 can be at least $5 \times 10^{18}$ atoms/cm$^3$ or at least $1 \times 10^{19}$ atoms/cm$^3$.

Figure 7:
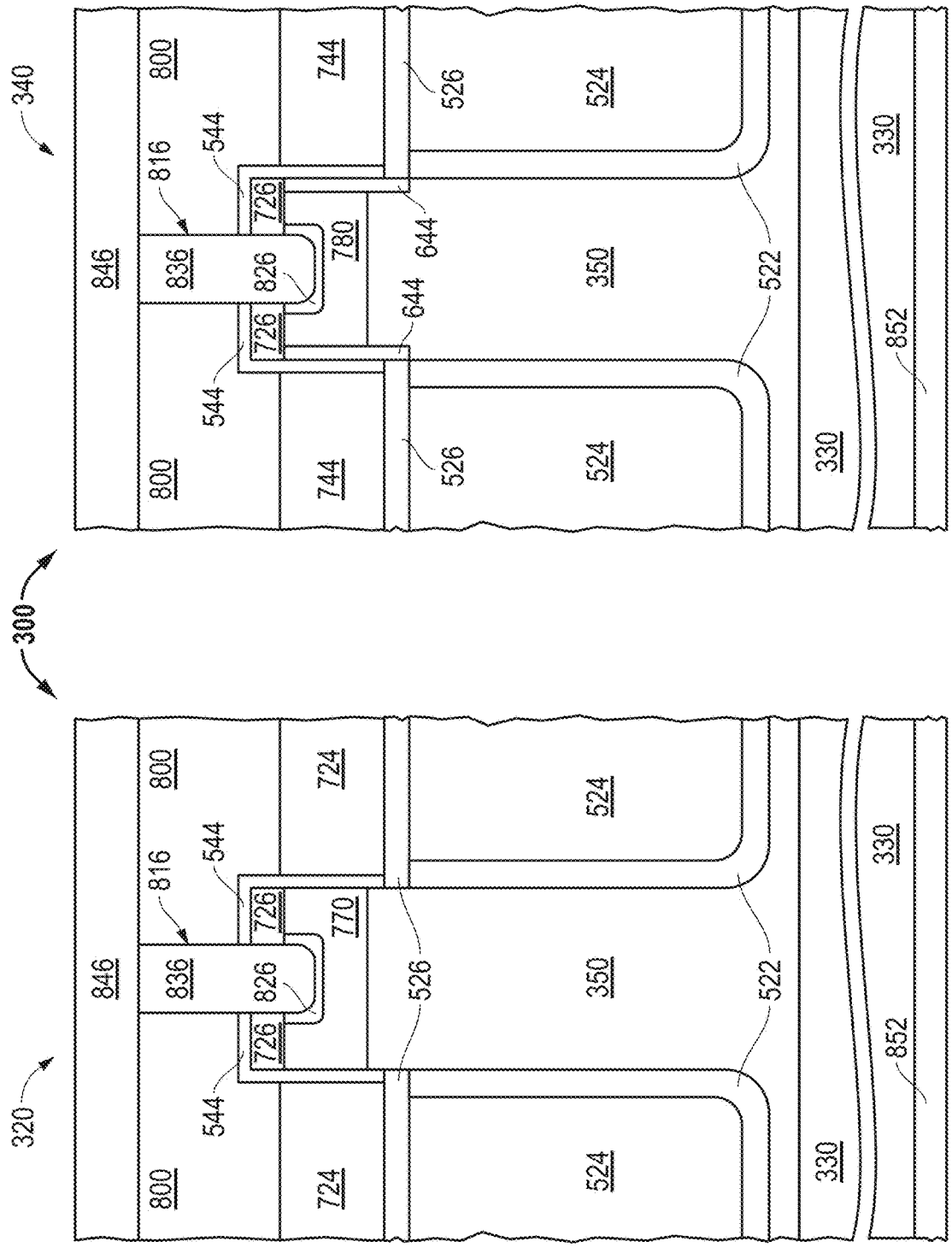
FIG. 7 includes an illustration of a cross-sectional view of the workpiece of FIG. 6 after forming a substantially completed electronic device in accordance with an embodiment.

FIG. 7 includes an illustration of the workpiece after forming a substantially completed electrode device. An interlevel dielectric ("ILD") layer 800 is formed over the workpiece 300 and can include an oxide, a nitride, an oxynitride, or any combination thereof. The ILD layer 800 can include a single film or a plurality of discrete films. An etch-stop film, an antireflective film, or a combination may be used within the ILD layer 800 to help with processing. In an embodiment, the ILD layer 800 has a thickness in a range from approximately 100 nm to approximately 1000 nm. The ILD layer 800 may be planarized using an etchback or polishing technique.

The ILD layer 800 can be patterned to define contact openings 816, and the workpiece 300 is implanted to form body contact regions 826. The contact openings 816 extend through the source regions 726 and expose portions of the body regions 770 and 780. The body contact regions 826 have the same conductivity type as the body regions 770 and 780, which are body regions for the structures being formed. The body contact regions 826 can have a peak dopant concentration sufficient to allow ohmic contacts to be made to conductive plugs 836. In an embodiment, the peak dopant concentration of the body contact regions 826 can be at least $5 \times 10^{18}$ atoms/cm$^3$ or at least $1 \times 10^{19}$ atoms/cm$^3$. Although not illustrated contact openings may be formed to the shield electrodes 524, the gate electrodes 724, and the electrodes 744 at locations not illustrated in FIG. 7.

Conductive plugs 836 are formed by forming a conductive layer over the workpiece and within the contact openings 816, and a portion of the conductive layer lying outside the contact openings 816 is removed by an etchback or polishing technique. The conductive layer can include any of the materials previously described within to the shield electrodes 524. In an embodiment, the conductive layer can include an adhesion layer, a barrier layer, and a bulk conductive layer. In a particular embodiment the adhesion layer can include Ti, the barrier layer can include TiN, and the bulk conductive layer can be W. Portions of Ti that is in contact with the source regions 726 and the body contact region 826 may or may not be reacted to form $TiSi_2$. Other conductive plugs 836 will also contact the shield electrodes 524, the gate electrodes 724 and electrodes 744 but are not illustrated in FIG. 7.

Interconnects, including a source interconnect 846, are formed over the ILD layer 800 and the conductive plugs 836. The interconnects are formed from a conductive layer and patterning the conductive layer. The conductive layer can include a single film or a plurality of films. In an embodiment, the conductive layer can include a lower film, a bulk conductive film, and an upper film.

The lower film can include an adhesion film, a barrier film, or both. The lower film can include refractory metal, such as titanium, tantalum, or the like; the barrier film can include a refractory metal nitride, such as titanium nitride, tantalum nitride, or the like, a refractory silicide, such as tungsten silicide, titanium silicide, or the like, or a refractory metal-semiconductor-nitride, such as TaSiN. The lower film can have a thickness in a range of 5 nm to 100 nm.

The bulk conductive film is responsible for providing low resistivity within the interconnects. In another embodiment, the bulk conductive film is typically at least 70 wt. % of aluminum, copper, or a noble metal. In an embodiment, the bulk conductive film can include at least 90 wt. % Al or Cu. The bulk conductive film can have a thickness that is in a range from 50% to 95% of the total thickness of the interconnects. In an embodiment, the thickness of the bulk conductive film can be in a range from 0.1 micron to 4.0 micron.

The upper film can be an antireflective or barrier film over the bulk conductive film. Thus, the upper film can aid in reducing reflections during patterning of a subsequently-formed resist layer. The upper film can include a metal nitride. The thickness of the upper film can depend on the particular material of the upper film and wavelength of radiation used to expose a resist layer. The thickness can be selected such that radiation when exposing a resist layer is sufficiently attenuated before reaching the bulk conductive film where the bulk conductive film can be highly reflective as compared to other materials within the electronic device. In an embodiment, the thickness of the upper film has a thickness in a range from 11 nm to 500 nm.

Other thicknesses for any of the lower, bulk conductive and upper films may be used without deviated from the concepts as described herein. After patterning the conductive layer, the source interconnects and the gate interconnects are formed. The source interconnects, including the source interconnect 846, are electrically coupled to the source regions 726, body contact regions 826, and the shield electrodes 524. The gate interconnects are electrically coupled to the gate electrodes 724 and the electrodes 744. In another embodiment, the electrodes 744 within the component portion 340 can be electrically coupled to the source interconnects, as opposed to the gate interconnects.

One or more other interconnect levels and a passivation layer may be formed over the workpiece. Each interconnect level can include an interlevel dielectric layer and interconnects. A conductive layer can be used at each interconnect level. The conductive layer may be the same or different from the other conductive layers described earlier in this specification. After forming the interconnect levels, an anneal may be performed.

The substrate 310 may be thinned during a backgrind operation, and metallization 852 can be formed along the backside of the substrate and be electrically coupled to the base region 330. The metallization 852 can be part of the drain terminal 102 or be electrically coupled to the drain terminal 102. The source terminal 106 can be electrically coupled to the source interconnects, including the source interconnect 846. The control terminal 104 is electrically coupled to the gate interconnects that are electrically coupled to the gate electrodes 724 and electrodes 744. The control terminal 104 can be electrically coupled to a gate driver or logic used to turn on and off the power transistor 120 and the ACCUFET corresponding to the component 140.

At this point in the process, transistor structures are formed within the power transistor portion 320 that make up the power transistor 120. The transistor structures have their source regions 726 electrically coupled to each other and their gate electrodes 724 electrically coupled to each other. The portions of the semiconductor regions between the trenches 420 and the underlying base region 330 are semiconductor pillars and include drift regions for the transistor structures of the power transistor 120. Component structures are formed within the component 140 that make up the ACCUFET. The component structures have their source regions 726 electrically coupled to each other and their electrodes 744 electrically coupled to each other.

The layout of the electronic device can be adjusted to achieve needed or desired electronic performance. The amount of area occupied by each of the power transistor portion 320 corresponding to the power transistor 120 and the component portion 340 corresponding to the component 140 can be varied. As used herein, the percentage of area occupied by the component portion 340 is the area occupied by the component region 340 divided by the combined area occupied by the portions 320 and 340 times 100%. The component portion 340 can occupy an area greater than 0% and up to 100%, meaning the power transistor portion 320 is not present. In practical application, the component portion 340 will occupy significantly less than 100%, as leakage current increases as with a higher percentage of area occupied by the component portion 340. In an embodiment, the component portion 340 can occupy an area in a range from 5% to 30% of the combined area. In another embodiment, the percentages may be lower than 5% or higher than 30%.

Figure 9:
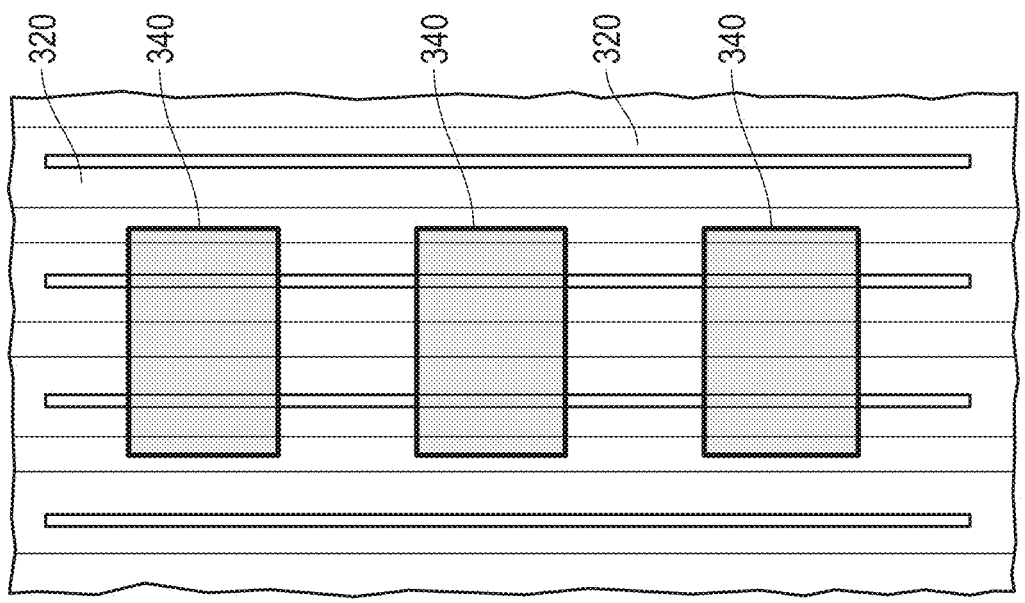
FIG. 9 includes an illustration of a top view of the electronic device including a transistor portion and component portions in accordance with another embodiment.
Figure 8:
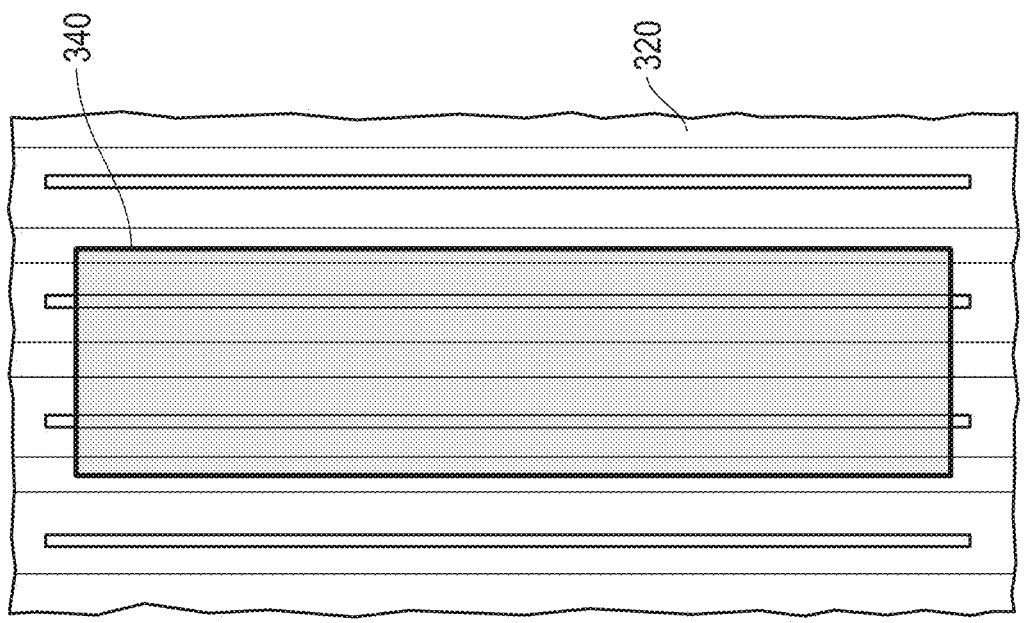
FIG. 8 includes an illustration of a top view of the electronic device including a transistor portion and a component portion in accordance with an embodiment.

FIGS. 8 to 11 include some illustrative layouts that can be used for the electronic device. FIG. 8 includes a layout where only selected semiconductor pillars are within the component portion 340. Other semiconductor pillars are within the power transistor region 320. FIG. 9 includes a layout where the pitch (combination of a power transistor portion 320 and a component portion 340) along one or more semiconductor pillars is substantially constant. FIG. 10 includes a layout where the areas of power transistor portion 320 and component portion 340 along one or more semiconductor pillars can be varied. Thus, a power transistor portion 320 may have a different size as compared to another power transistor portion 320 along such semiconductor pillar(s), or a component portion 340 may have a different size as compared to another component portion 340 along such semiconductor pillar(s). FIG. 11 includes a layout where locations of the component portion 340 can have different sizes and are located in different semiconductor pillars. The locations may be selected to allow performance benefits.

Any of the layouts described with respect FIGS. 8 to 11 may be used for the preceding and any of the preceding and subsequently described embodiments. After reading this specification, skilled artisans will appreciate that other layouts may be used to achieve the needs or desires for the particular application without deviating from the concepts described herein.

Other embodiments can be used for the component 140. FIGS. 12 to 15 focus on alternate embodiments for the component 140. The power transistor 120 and its corresponding structure within the power transistor portion 320 as illustrated in FIG. 7 may or may not be present with component 140 and its structures and corresponding circuit-equivalent for such structures. Frequent reference will be made to prior figures. After reading this specification in its entirety, skilled artisans will be able to correlate features described below with the same or similar features as previously described and illustrated.

Figure 12:
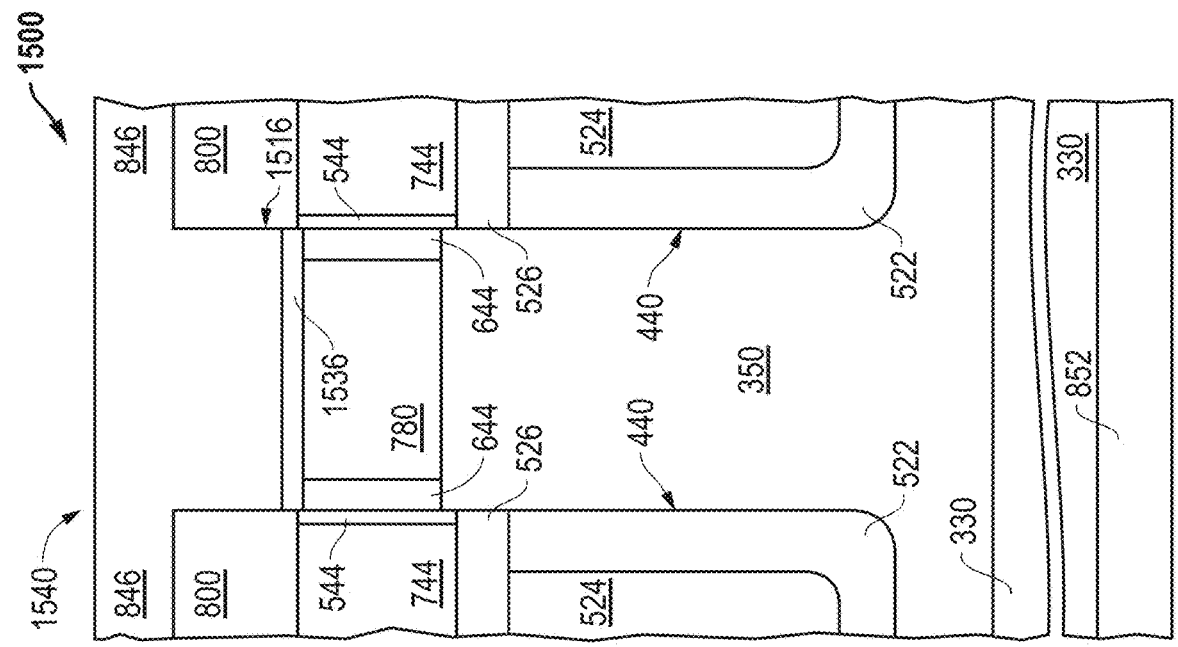
FIG. 12 includes an illustration of a cross-sectional view of a workpiece corresponding to the component depicted in FIG. 1.

FIG. 12 includes an illustration of cross-sectional view of a component portion 1540 of a workpiece 1500. Although not illustrated, the workpiece 1500 includes the power transistor portion 320, as previously described, that corresponds to the power transistor 120. The component portion 1540 corresponds to the component 140 illustrated in FIG. 1. Many of the features illustrated in the embodiment of FIG. 12 have been previously described, and thus, the formation of the component structure within the component portion 1540 is similar to the component structure within the component portion 340 as illustrated in FIG. 7. Thus, attention is directed to structure and process differences between the component structures within component portions 340 and 1540. Referring to the embodiment illustrated in FIG. 12, source regions are not formed near the tops of the semiconductor pillars adjacent to the trenches 440.

A Schottky layer 1536 is formed over the semiconductor pillar in FIG. 12 to form a Schottky contact between the Schottky layer 1536 and the doped regions 644. Under reverse bias, a Schottky junction between the Schottky layer 1536 and the doped regions 644 is shielded from high electrical field by the depletion from the body region 780 and the depletion from MOS effect of the source electrode 744. The dopant concentrations of the doped regions 644 is sufficiently low to allow a Schottky contact, rather than an ohmic contact, to be formed. The Schottky layer 1536 can include a metal-containing conductive layer, such as Ti, $TiSi_2$, TiN, Ta, TaSi, TaN, Co, Pt, W, TiW, Ni, Cr, or the like. The thickness of the Schottky layer 1536 is sufficient to allow a Schottky diode to be formed at the Schottky contact but not so thick to cause too much resistance loss across the Schottky layer 1536. In an embodiment, the Schottky layer 1536 has a thickness in a range from 11 nm to 99 nm.

After reading this specification, skilled artisans will appreciate the timing when to form the Schottky layer 1536 and whether or not a silicide mask is to be used (when forming the Schottky layer 1536 when the Schottky layer 1536 is a metal silicide) can be tailored for a particular application. The Schottky layer 1536 is formed after forming the doped regions 644 and the body region 780 and may be formed before forming the source interconnect 836 or may be formed as part of the source interconnect 836. Thus, the formation of the Schottky layer 1536 can be tailored to meet the desire or needs for a particular application.

After forming the ILD layer 800, contact openings for the component portion 1540, including contact openings 1516 are formed. The contact openings 1516 may have the same width or be wider as compared to the contact openings 816 within the power transistor portion 320. The component portion 1540 does not receive doping when forming the body contact regions 826 for the transistor structures within the power transistor portion 320. Although not illustrated in FIG. 12, other contact openings extend to the electrodes 744 in the component portion 1540. The patterning of the ILD layer 800 to form the contact openings for the portions 320 and 1540 can be performed during the same etch sequence or during different etch sequences.

The source and gate interconnects can be formed as previously described. The electrodes 744 are electrically coupled to the source terminal 106 rather than the control terminal 104. The source interconnect 846 contacts the Schottky layer 1536 and the electrodes 744, although the contact between the source interconnect 846 and the electrodes 744 is not illustrated in FIG. 12. Thus, the source interconnect 846 can be electrically connected to the source regions 726 and the body contact regions 826 within the power transistor portion 320 and can be electrically connected to the electrodes 744 and electrically coupled to the doped regions 644 and body region 780 via the Schottky layer 1536 within the component portion 1540. The gate interconnects (not illustrated in FIG. 12) for the power transistor 120 of the power transistor portion 320 are electrically connected to the gate electrodes 724 and not to the electrodes 744 in the component portion 1540.

The embodiment as illustrated in FIG. 12 can use the same process flow as previously described with respect to the embodiment as illustrated in FIG. 7. Changes to mask designs may be implemented to achieve the structures in component portion 1540. No new masks or processing operations may be required. Any of the layouts as previously described, such as the layouts illustrated in FIGS. 8 to 11, may be used with the embodiment illustrated in FIG. 12.

Figure 13:
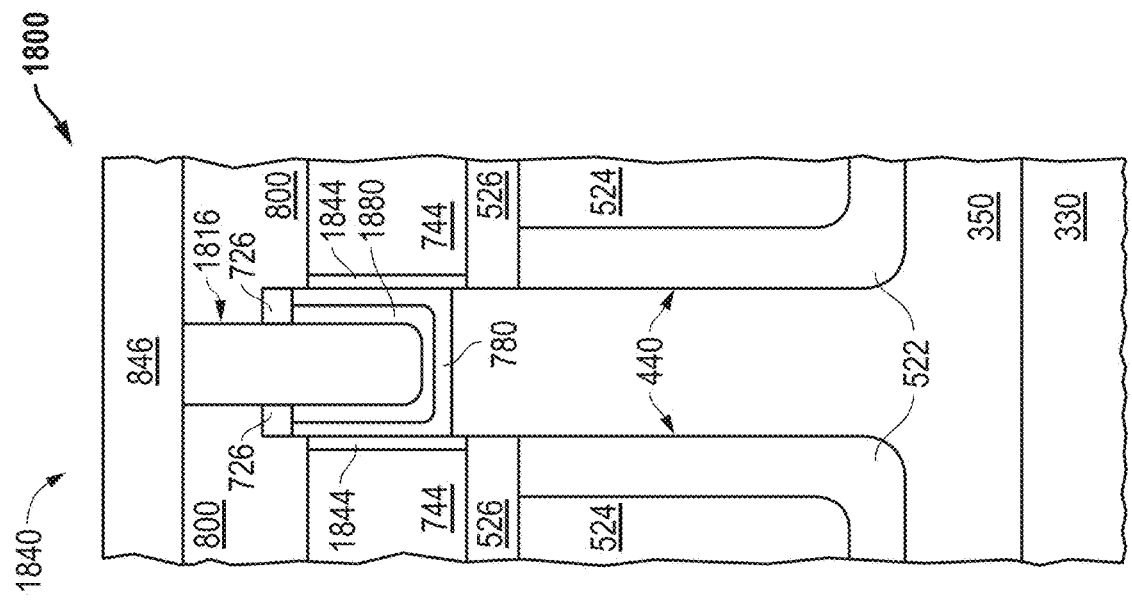
FIG. 13 includes an illustration of a cross-sectional view of a workpiece corresponding to the component depicted in FIG. 1 in accordance with another embodiment.

In another embodiment, doping a portion of the semiconductor layer 350 can be performed after forming contact openings to the semiconductor pillars rather than doping sidewalls of the semiconductor pillars. FIG. 13 includes an illustration of cross-sectional views of a component portion 1840 of a workpiece 1800. Although not illustrated, the workpiece 1800 includes the power transistor portion 320, as previously described, that corresponds to the power transistor 120. The component portion 1840 corresponds to the component 140 illustrated in FIG. 1.

Many of the features illustrated in the embodiment of FIG. 13 have been previously described, and thus, the formation of the component structure within the component portion 1840 is similar to the component structure within the component portion 340 as illustrated in FIG. 7. Thus, attention is directed to structure and process differences between the component structures within component portions 340 and 1840. Referring to the embodiment illustrated in FIG. 7, the doped regions 644 and the body region 780 are not formed near the tops of the semiconductor pillars adjacent to the trenches 440. Thus, a masking layer overlies the component portion 1840 when forming the body region 770 within the power transistor portion 320 for the power transistor 120.

Referring to FIG. 13, after forming the contact openings 1816, doped regions 1880 can be formed adjacent to the contact openings 1816. The power transistor portion 320 can be masked to keep a doped region similar to the doped regions 1880 from being formed along sidewalls of the contact openings 1816. If needed or desired, widths of the semiconductor pillars within the component portion 1840, widths of the contact openings 1816, or both can be varied. The semiconductor pillars within the component portion 1840 can have widths that are the same, narrower, or wider than the semiconductor pillars within the power transistor portion 320. The contact openings 1816 can have widths that are the same, narrower, or wider than the contact openings 816.

The formation of the doped regions 1880 can be performed using any of the techniques described with respect to the doped regions 644 except that the conductivity type of the dopant used to form the doped regions 1880 is the opposite that of the doped regions 644. The implant parameters for the doped regions 1880 affect the widths of portions 1844 of the semiconductor layer 350 that remain between the doped regions 1880 and the corresponding sidewall of the trenches 440. The portions 1844 correspond to an accumulation channel of an ACCUFET and are similar to the doped regions 644 previously described. The average dopant concentration of the semiconductor layer 350 near the tops of the semiconductor pillars, the length of the portions 1844 of the semiconductor layer 350 between the source regions 726 and the lowest elevation of the doped regions 1880, and the above-referenced widths for portions 1844 of the semiconductor layer 350 are selected to achieve a needed or desired resistance for the resistor 144.

Doping to form the body contact regions 826 can be performed before or after forming the doped regions 1880. In another embodiment, both the doped regions 1880 and body contact regions 826 within the component portion 1840 can be replaced by a doped region of the same conductivity type and be formed using a single doping operation. Processing can continue with formation of the conductive plugs 836 and source interconnects 846 as previously described with respect to the embodiment of FIG. 7.

Any of the layouts as previously described, such as the layouts illustrated in FIGS. 8 to 11, may be used with the embodiment illustrated in FIG. 13.

Figure 14:
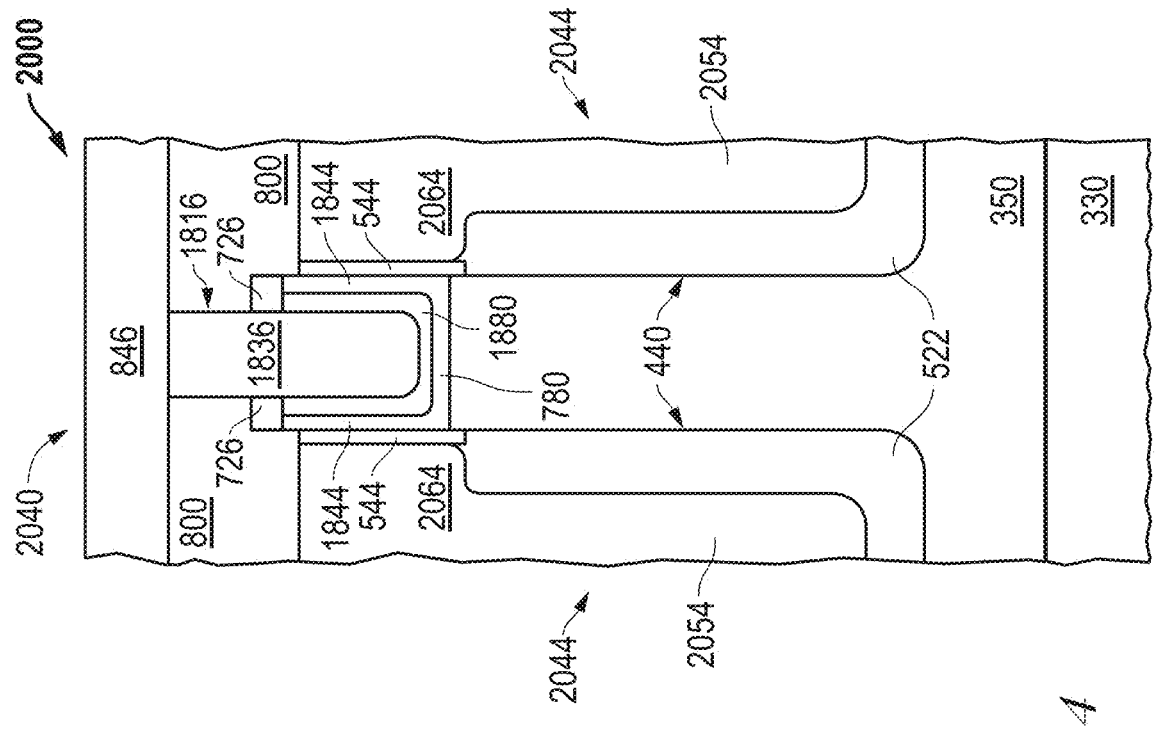
FIG. 14 includes an illustration of a cross-sectional view of a workpiece corresponding to the component depicted in FIG. 1.

FIG. 14 includes an illustration of a cross-sectional view of a component portion 2040 of a workpiece 2000. The component portion 2040 corresponds to the component 140 in FIG. 1. Although not illustrated, the workpiece 2000 can include the power transistor portion 320, as previously described, that corresponds to the power transistor 120.

Many of the features illustrated in the embodiment of FIG. 14 have been previously described, and thus, the formation of the component structure within the component portion 2040 is similar to the component structure within the component portion 1840 as illustrated in FIG. 13. Thus, attention is directed to structure and process differences between the component structures within component portions 1840 and 2040. Electrodes 2044 include portions 2054 and 2064. Referring to the embodiment illustrated in FIG. 14, the insulating layer 526 as illustrated in previous figures is not formed. Within the trenches 440 of the component portion 340, the combination of the shield electrodes 524, the insulating layer 526, and the gate electrodes 724 are replaced by the electrodes 2044 in the component portion 2040 of the workpiece 2000 in FIG. 14.

Attention is directed to the process of forming the structure as illustrated in FIG. 14. The shield electrodes 524 are formed within the trenches 420 of the power transistor portion 320 and the portions 2054 of the electrodes 2044 are formed within the trenches 440 of the component portions 2040. Thus, the portions 2054 provide substantially the same electrical function as the shield electrodes 524 within the trenches 440 as previously described with respect to other embodiments. The insulating layer 526 is formed within trenches 420 and 440 in portions 320 and 2040, respectively. The insulating layer 526 is removed from the sidewalls of the trenches 420 and 440. After removing the mask, the gate dielectric layer 544 is formed within the trenches 420 and 440 of the portions 320 and 2040. A mask (not illustrated) is formed over the power transistor portion 320 to protect the insulating layer 526 within the trenches 420 of the power transistor portion 320, and the insulating layer 526 and the gate dielectric layer 544 are removed from the trenches 440 within the component portion 2040. The gate electrodes 724 are formed within the trenches 420 of the power transistor portion 320, and the portions 2064 of the electrodes 2044 are formed within the trenches 440 of the component portion 2040. The gate electrodes 724 and the portions 2064 of the electrodes can be formed during the same processing sequence. The electrodes 2044 include combinations of the portions 2054 and 2064 as illustrated in FIG. 14. Later in the process sequence, the ILD layer 800 can be patterned to define contact openings 1816, and conductive plugs 1836 are formed within the openings 1816. The contact openings 1816 and conductive plugs 1836 can be formed during the same process sequence to form the contact openings 816 and conductive plugs 836, respectively. The source interconnects 846 contact the conductive plugs 1836.

Although not illustrated, part of the doped region 1880 can extend to a sidewall of one of the trenches 440. Thus, the portion of the semiconductor layer 350 may be discontinuous along a sidewall of one of the trenches 440.

Any of the layouts as previously described, such as the layouts illustrated in FIGS. 8 to 11, may be used with the embodiment illustrated in FIG. 14.

Figure 15:
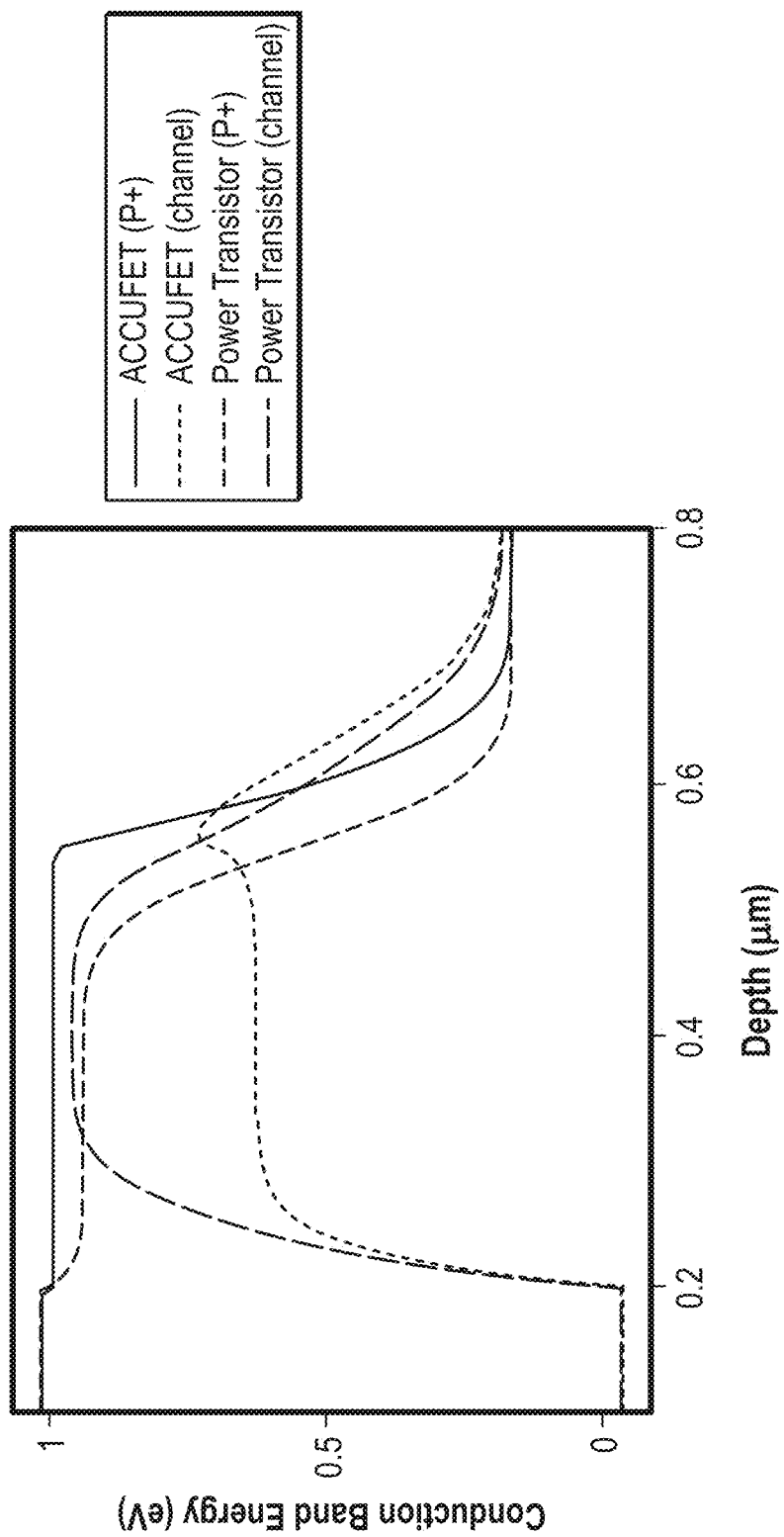
FIG. 15 includes a plot of conduction band energy as a function of distance from a primary surface for a transistor structure and a component structure.

Embodiments previously described can help to reduce $Q_{RR}$. FIG. 15 includes a plot of conduction band energy as a function of distance from the primary surface of the workpiece. The portion from 0.0 microns to 0.2 microns corresponds to the source regions 726, and the portion from 0.2 microns to approximately 0.55 microns represents the body regions 770 and 780. As can be seen with the dashed line corresponding to the ACCUFET (channel), the doped regions 644 allow the conduction band energy to be reduced by 0.25 eV to 0.35 eV as compared to a transistor structure without the doped region 644 (Power Transistor (channel) in FIG. 15).

Figure 16:
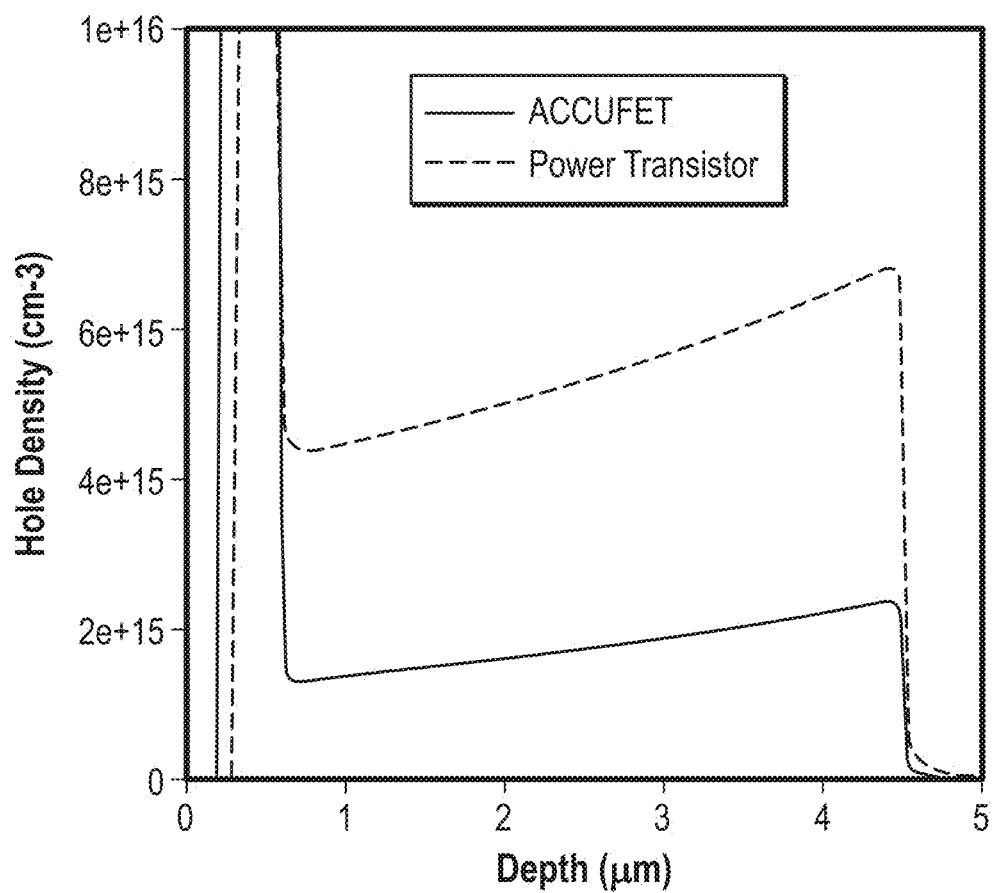
FIG. 16 includes a plot of hole density as a function of distance from a primary surface for a transistor structure and a component structure.

FIG. 16 includes a plot of hole density as a function of distance from the primary surface when the power transistor 120 is in an on-state. The drift region corresponds to the portion of the semiconductor layer 350 between the base region 330 and each the body regions 770 and 780. The drift region is from approximately 0.55 micron to 4.5 microns from the primary surface 312. As can be seen in the plot, the hole density corresponding to the component structures of the component 140 are in a range of 30% to 40% lower than the hole density corresponding to the transistor structures of the power transistor 120. The actual reduction in hole density may depend on the dopant concentrations and geometries of the device. Thus, the actual reduction in hole density can have values higher or lower the range described above.

Other embodiments, such as with doped regions 1880 and remaining portions 1844 of the semiconductor layer 350, will have similar characteristics to those illustrated in FIGS. 15 and 16.

Thus, embodiments allow for the accumulation channel to lower the barrier for the body diode turn-on. As a result, in the third quadrant, the current flows as majority carriers through the accumulation channel region. Thus, stored minority carrier charge is reduced which reduces $Q_{RR}$. Thus, stored charge and $Q_{RR}$ are reduced, leading to lower switching losses.

Much of the prior description addresses the power transistor 120 being an IGFET. In a further embodiment, the power transistor 120 can be replaced with an insulated-gate bipolar transistor (IGBT).

Many different aspects and embodiments are possible. Some of those aspects and embodiments are described below. After reading this specification, skilled artisans will appreciate that those aspects and embodiments are only illustrative and do not limit the scope of the present invention.

Embodiment 1. A process of forming an electronic device can include patterning a substrate to define a first trench, wherein the substrate includes a first doped region having a first conductivity type, wherein the first trench extends at least partly through the first doped region; forming a second doped region within a first semiconductor pillar and along a sidewall of the first trench, wherein the second doped region has the first conductivity type; forming a third doped region within the first semiconductor pillar, wherein the third region has a second conductivity type opposite the first conductivity type; and forming a first contact to the third doped region. In a finished device, the second doped region and the third doped region can overlie the first doped region, at least a part of the third doped region can be spaced apart from the sidewall of the first semiconductor pillar by the second doped region, and the second doped region can lie along a current path between the first doped region and the first contact.

Embodiment 2. The process of Embodiment 1 further includes forming an insulating layer along the sidewall and a bottom of the first trench; and forming a shield electrode within the first trench, wherein the insulating layer is disposed between the substrate and the shield electrode.

Embodiment 3. The process of Embodiment 2, wherein forming the insulating layer and forming the shield electrode are performed before forming the second doped region.

Embodiment 4. The process of Embodiment 1 further includes forming a dielectric layer along the sidewall of the first trench before forming the second doped region; and forming a first electrode within the first trench after forming the second doped region.

Embodiment 5. The process of Embodiment 4, wherein, in the finished device, the second doped region, the third doped region, the dielectric layer, and the first electrode are parts of a component structure.

Embodiment 6. The process of Embodiment 4, wherein patterning the substrate includes patterning the substrate to define a second trench, wherein the second trench has a sidewall and extends at least partly through the first doped region, and during forming the second doped region, substantially no dopant is introduced into a second semiconductor pillar that is immediately adjacent to the second trench. The process can further includes forming a gate dielectric layer along the sidewall of the second trench; forming a gate electrode within the second trench, wherein the gate dielectric is disposed between the gate electrode and the sidewall of the second trench; forming a body region that overlies the first doped region and is along a sidewall of the second trench; forming a current-carrying region adjacent to the second trench; and forming a second contact to the body region and the current-carrying region. In the finished device, the body region extends to the sidewall of the second trench, and the body region, the gate dielectric layer, the gate electrode, and the current-carrying region are parts of a transistor structure.

Embodiment 7. The process of Embodiment 6 further includes forming a first insulating layer along the sidewall and a bottom of the first trench and along the sidewall and a bottom of the second trench; forming a first shield electrode within the first trench and forming a second shield electrode within the second trench; and forming a second insulating layer over the first shield electrode and forming a third insulating layer over the second shield electrode, wherein forming the second insulating layer and forming the third insulating layer are performed before forming the dielectric layer. In the finished device, the first contact, the second contact, the first shield electrode, the second shield electrode, and the current-carrying region are electrically connected to one another, the component structure is at least part of a component, the transistor structure is at least part of a power transistor, and an area occupied by the component is in a range from 5% to 30% of a combined area occupied by the component and the transistor.

Embodiment 8. The process of Embodiment 6, wherein the component structure is at least part of a component, the transistor structure is at least part of a transistor, and an area occupied by the component is in a range from 5% to 30% of a combined area occupied by the component and the transistor.

Embodiment 9. The process of Embodiment 5 further includes forming a current-carrying region that overlies the third doped region and contacts the second doped region; forming a first contact opening extending into the third doped region; and forming a doped contact region within the third doped region and along a surface of the first contact opening. Forming the first contact is performed such that an ohmic contact is formed to the third doped region and the current-carrying region.

Embodiment 10. The process of Embodiment 4, wherein, in the finished device, a Schottky contact is made to the second doped region.

Embodiment 11. The process of Embodiment 10, wherein forming the second doped region is performed, such that in the finished device, the third doped region has an average dopant concentration in a range from $1 \times 10^{16}$ atoms/cm$^3$ to $9 \times 10^{17}$ atoms/cm$^3$.

Embodiment 12. The process of Embodiment 1, wherein the second doped region is discontinuous along the sidewall of the first trench.

Embodiment 13. The process of Embodiment 1, wherein forming the second doped region is performed using a tilt angle implant.

Embodiment 14. A process of forming an electronic device can include patterning a substrate to define a first trench having a first trench depth, wherein the substrate includes a first doped region having a first conductivity type, and the first trench has a sidewall and extends at least partly through the first doped region; and patterning the substrate to define an opening having an opening depth, wherein the opening has a sidewall and extends into the first doped region, the opening overlies a first portion of the first doped region, and the opening is spaced apart from the first trench by a second portion of the first doped region. The process can further include forming a second doped region adjacent to the sidewall of the opening, wherein the second doped region has a second conductivity type opposite the first conductivity type; and forming a first contact to the second doped region. In a finished device, a third portion of the first doped region is disposed along the sidewall of the first trench at an elevation above a lowermost point of the second doped region, and the third portion of the first doped region lies along a current path between the first portion of the first doped region and the first contact.

Embodiment 15. The process of Embodiment 14, wherein forming the second doped region is performed using a tilt angle implant.

Embodiment 16. The process of Embodiment 14 further includes forming an insulating layer within the first trench; forming a first portion of a first electrode within the first trench, wherein the insulating layer is disposed between the sidewall of the first trench and the first portion of the first electrode; forming a dielectric layer within the first trench, wherein the dielectric layer is thinner as compared to the insulating layer; and forming a second portion of the first electrode within the first trench, wherein the dielectric layer is disposed between the sidewall of the first trench and the second portion of the first electrode, and the second portion of the first electrode contacts the first portion of the first electrode.

Embodiment 17. The process of Embodiment 14, where the second doped region contacts the sidewall of the first trench.

Embodiment 18. The process of Embodiment 14 further includes forming a first current-carrying region adjacent to the first trench and electrically connected to the first contact, wherein in the finished device, the second doped region, the dielectric layer, and the first current-carrying region are parts of a component structure.

Embodiment 19. The process of Embodiment 18, wherein patterning the substrate includes patterning the substrate to define a second trench, wherein the second trench has a sidewall and extends at least partly through the first doped region. The process can further include forming a gate electrode within the second trench; forming a body region within a mesa immediately adjacent to the second trench, wherein the body region extends to a sidewall of the second trench, and the body region has the second conductivity type; forming a second current-carrying region adjacent to the second trench; and forming a second contact to the body region and the second current-carrying region. In the finished device, the body region, the gate dielectric layer, the gate electrode, and the second current-carrying region are parts of a transistor structure.

Embodiment 20. The process of Embodiment 19, wherein the first current-carrying region is at least part of a first terminal of the component structure, the second current-carrying region is at least part of a source of the transistor structure, the first terminal of the component structure, the first electrode of the component structure, and the source of the transistor are electrically connected to one another, the gate electrode of the transistor structure is electrically connected to a control terminal of the transistor structure, and a second terminal of the component structure and a drain of the transistor structure are electrically connected to each other.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A process, comprising:
    patterning a substrate to define a first trench, wherein the substrate includes a first doped region having a first conductivity type, wherein the first trench extends at least partly through the first doped region;
    forming a second doped region within a first semiconductor pillar and along a sidewall of the first trench, wherein the second doped region has the first conductivity type, wherein the second doped region has a greater average dopant concentration as compared to the first doped region;
    forming a third doped region within the first semiconductor pillar, wherein the third doped region has a second conductivity type opposite the first conductivity type;
    forming a source region within the first semiconductor pillar and along the sidewall of the first trench, wherein the source region has the first conductivity type; and
    forming a first contact to the third doped region,
    wherein, in a finished electronic device:
        the second doped region and the third doped region overlie the first doped region,
        at least a part of the third doped region is spaced apart from the sidewall of the first trench by the second doped region,
        the second doped region lies along a current path between the first doped region and the first contact, and
        the source region extends a first distance from the sidewall of the first trench, the second doped region extends a second distance from the sidewall of the first trench, and the first distance is greater than the second distance.

2. The process of claim 1, further comprising:
    forming an insulating layer along the sidewall and a bottom of the first trench; and
    forming a shield electrode within the first trench, wherein the insulating layer is disposed between the substrate and the shield electrode.

3. The process of claim 2, wherein forming the insulating layer and forming the shield electrode are performed before forming the second doped region.

4. The process of claim 1, further comprising:
forming a dielectric layer along the sidewall of the first trench before forming the second doped region; and
forming a first electrode within the first trench after forming the second doped region.

5. The process of claim 4, wherein, in the finished electronic device, the second doped region, the third doped region, the dielectric layer, and the first electrode are parts of a component structure.

6. The process of claim 5, wherein:
patterning the substrate comprises patterning the substrate to define a second trench, wherein the second trench has a sidewall and extends at least partly through the first doped region,
during forming the second doped region, substantially no dopant is introduced into a second semiconductor pillar that is immediately adjacent to the second trench,
the process further comprises:
forming a gate dielectric layer along the sidewall of the second trench;
forming a gate electrode within the second trench, wherein the gate dielectric layer is disposed between the gate electrode and the sidewall of the second trench;
forming a body region that overlies the first doped region and is along the sidewall of the second trench;
forming a current-carrying region adjacent to the second trench; and
forming a second contact to the body region and the current-carrying region, and in the finished electronic device,
the body region extends to the sidewall of the second trench, and
the body region, the gate dielectric layer, the gate electrode, and the current-carrying region are parts of a transistor structure.

7. The process of claim 6, further comprising:
forming a first insulating layer along the sidewall and a bottom of the first trench and along the sidewall and a bottom of the second trench;
forming a first shield electrode within the first trench and forming a second shield electrode within the second trench; and
forming a second insulating layer over the first shield electrode and forming a third insulating layer over the second shield electrode, wherein forming the second insulating layer and forming the third insulating layer are performed before forming the dielectric layer,
wherein, in the finished electronic device:
the first contact, the second contact, the first shield electrode, the second shield electrode, and the current-carrying region are electrically connected to one another,
the component structure is at least part of a component,
the transistor structure is at least part of a power transistor, and
an area occupied by the component is in a range from 5% to 30% of a combined area occupied by the component and the power transistor.

8. The process of claim 6, wherein:
the component structure is at least part of a component,
the transistor structure is at least part of a transistor, and
an area occupied by the component is in a range from 5% to 30% of a combined area occupied by the component and the transistor.

9. The process of claim 5, further comprising:
forming a current-carrying region that overlies the third doped region and contacts the second doped region;
forming a first contact opening extending into the third doped region; and
forming a doped contact region within the third doped region and along a surface of the first contact opening,
wherein forming the first contact is performed such that an ohmic contact is formed to the third doped region and the current-carrying region.

10. The process of claim 4, wherein, in the finished electronic device, a Schottky contact is made to the second doped region.

11. The process of claim 10, wherein forming the second doped region is performed, such that in the finished electronic device, the third doped region has an average dopant concentration in a range from $1 \times 10^{16}$ atoms/cm$^3$ to $9 \times 10^{17}$ atoms/cm$^3$.

12. The process of claim 1, wherein the second doped region is discontinuous along the sidewall of the first trench.

13. The process of claim 1, wherein forming the second doped region is performed using a tilt angle implant.

14. A process, comprising:
patterning a substrate to define a first trench, wherein the substrate includes a first doped region having a first conductivity type, wherein the first trench extends at least partly through the first doped region;
forming a second doped region within a first semiconductor pillar and along a sidewall of the first trench, wherein the second doped region has the first conductivity type;
forming a third doped region within the first semiconductor pillar, wherein the third doped region has a second conductivity type opposite the first conductivity type; and
forming a first contact to the second doped region and the third doped region, wherein the first contact is a Schottky contact to the second doped region and the third doped region,
wherein, in a finished electronic device:
the second doped region and the third doped region overlie the first doped region,
at least a part of the third doped region is spaced apart from the sidewall of the first trench by the second doped region,
the second doped region lies along a current path between the first doped region and the first contact, and
the second doped region, the third doped region, and the first contact are parts of a component structure, and the component structure does not include a source region.

15. The process of claim 14, wherein forming the second doped region is performed after patterning the substrate and comprises doping a portion of the first semiconductor pillar along the sidewall of the first trench.

16. The process of claim 15, wherein doping the portion of the first semiconductor pillar is performed using a tilt angle implant.

17. The process of claim 14, further comprising:
forming a dielectric layer along the sidewall of the first trench before forming the second doped region; and
forming a first electrode within the first trench after forming the second doped region.

18. A process, comprising:
patterning a substrate to define a first trench, wherein the substrate includes a primary surface and a first doped region having a first conductivity type, wherein the first trench extends at least partly through the first doped region;

forming a second doped region within a first semiconductor pillar and along a sidewall of the first trench, wherein the second doped region has the first conductivity type, wherein the second doped region has a greater average dopant concentration as compared to the first doped region;

forming a third doped region within the first semiconductor pillar, wherein the third doped region has a second conductivity type opposite the first conductivity type; and forming a first contact to the third doped region, wherein, in a finished electronic device:
the second doped region and the third doped region overlie the first doped region,
the second doped region extends into in the first semiconductor pillar to a deeper depth as compared to the third doped region, wherein depth is measured in a direction perpendicular to the primary surface,
at least a part of the third doped region is spaced apart from the sidewall of the first trench by the second doped region, and
the second doped region lies along a current path between the first doped region and the first contact.

19. A process, comprising:

patterning a substrate to define a first trench, wherein:
the substrate includes a first doped region having a first conductivity type,
the first trench extends at least partly through the first doped region, and
a first semiconductor pillar and a second semiconductor pillar are spaced apart from each other at least by the first trench;

forming a first body region within the first semiconductor pillar, wherein the first body region has a second conductivity type opposite the first conductivity type;

forming a second body region within the second semiconductor pillar, where the second body region has the second conductivity type;

forming a resist member over the second semiconductor pillar and not over the first semiconductor pillar;

forming a second doped region within a first semiconductor pillar and along a sidewall of the first trench, wherein forming the second doped region has the first conductivity type and is performed while the resist member overlies the second semiconductor pillar;

forming a first source region within the first semiconductor pillar, wherein the first source region has the first conductivity type;

forming a second source region within the second semiconductor pillar, wherein the second source region has the first conductivity type;

forming a first body contact region within a first portion of the first body region; and forming a second body contact region within a second portion of the second body region;

wherein, in a finished electronic device:
the first body region has a first average dopant concentration that is different from a second average dopant concentration of the second body region, and
the second doped region lies along a current path between the first doped region and the first source region.

20. The process of claim 19, wherein, in the finished electronic device:

the first body region, the second doped region, the first source region, and the first body contact region are parts of a component structure, the component structure is at least part of a component, the second body region, the second source region, and the second body contact region are parts of a transistor structure, the transistor structure is at least part of a transistor, and an area occupied by the component is in a range from 5% to 30% of a combined area occupied by the component and the transistor.

* * * * *